(12) United States Patent
Mizuuchi et al.

(10) Patent No.: US 7,907,646 B2
(45) Date of Patent: Mar. 15, 2011

(54) LASER LIGHT SOURCE AND DISPLAY DEVICE

(75) Inventors: Kiminori Mizuuchi, Osaka (JP); Kazuhisa Yamamoto, Osaka (JP); Hiroyuki Furuya, Nara (JP); Toshifumi Yokoyama, Osaka (JP)

(73) Assignee: Panasonic Corporation, Osaka (JP)

( * ) Notice: Subject to any disclaimer, the term of this patent is extended or adjusted under 35 U.S.C. 154(b) by 567 days.

(21) Appl. No.: 11/997,108

(22) PCT Filed: Jul. 28, 2006

(86) PCT No.: PCT/JP2006/315018
§ 371 (c)(1),
(2), (4) Date: Jan. 28, 2008

(87) PCT Pub. No.: WO2007/013608
PCT Pub. Date: Feb. 1, 2007

(65) Prior Publication Data
US 2010/0150186 A1   Jun. 17, 2010

(30) Foreign Application Priority Data
Jul. 28, 2005  (JP) ................................. 2005-218256

(51) Int. Cl.
*H01S 3/10* (2006.01)
(52) U.S. Cl. ........... 372/21; 372/23; 372/36; 372/43.01; 372/50.121; 372/68; 372/75
(58) Field of Classification Search ............ 372/21, 372/23, 36, 43.01, 50.121, 68, 75
See application file for complete search history.

(56) References Cited

U.S. PATENT DOCUMENTS

| 5,115,445 A |   | 5/1992 | Mooradian |
|---|---|---|---|
| 5,351,259 A | * | 9/1994 | Ishimori et al. .................. 372/75 |
| 5,428,635 A | * | 6/1995 | Zhiglinsky et al. ............. 372/92 |
| 5,802,086 A | * | 9/1998 | Hargis et al. .................... 372/22 |

(Continued)

FOREIGN PATENT DOCUMENTS
EP  0 455 383  11/1991
(Continued)

OTHER PUBLICATIONS

International Search Report issued Oct. 24, 2006 in International(PCT) Application No. PCT/JP2006/315018.

(Continued)

*Primary Examiner* — Minsun Harvey
*Assistant Examiner* — Yuanda Zhang
(74) *Attorney, Agent, or Firm* — Wenderoth, Lind & Ponack, L.L.P.

(57) ABSTRACT

According to the present invention, a laser light source comprises plural semiconductor lasers (2), a solid laser (4), a non-linear material (3) as a wavelength conversion element, a reflection coat (5) formed on one facet of the solid laser, and a reflection coat (6) formed on one facet of the non-linear material (3), and the solid laser and the wavelength conversion element are disposed between the both reflection coats to constitute a laser resonator, and plural pump parts (8) in the solid laser (4) which are pumped by the plural semiconductor lasers are separated from each other by 300 μm or more. Thereby, interference between transverse modes of laser oscillation is avoided, thereby providing a high-power, stable, and compact solid laser light source with which a stable high output power can be obtained.

6 Claims, 23 Drawing Sheets

U.S. PATENT DOCUMENTS

| | | | |
|---|---|---|---|
| 5,838,709 A | 11/1998 | Owa | |
| 6,061,369 A | 5/2000 | Conradi | |
| 6,297,179 B1 | 10/2001 | Beall et al. | |
| 6,433,928 B1 | 8/2002 | Nukui et al. | |
| 6,711,183 B1 * | 3/2004 | Mizuuchi et al. | 372/22 |
| 6,813,306 B2 * | 11/2004 | Momiuchi et al. | 372/97 |
| 7,082,150 B2 * | 7/2006 | Momiuchi | 372/75 |
| 2004/0052286 A1 | 3/2004 | Momiuchi | |
| 2004/0062285 A1 | 4/2004 | Uchizaki et al. | |
| 2005/0073651 A1 | 4/2005 | Yamamoto | |

FOREIGN PATENT DOCUMENTS

| | | |
|---|---|---|
| EP | 0 625 811 | 11/1994 |
| JP | 2-282226 | 11/1990 |
| JP | 4-134891 | 5/1992 |
| JP | 4-229677 | 8/1992 |
| JP | 4-241484 | 8/1992 |
| JP | 5-226752 | 9/1993 |
| JP | 5-87976 | 11/1993 |
| JP | 6-500432 | 1/1994 |
| JP | 6-102553 | 4/1994 |
| JP | 6-268290 | 9/1994 |
| JP | 8-46280 | 2/1996 |
| JP | 9-246648 | 9/1997 |
| JP | 10-261825 | 9/1998 |
| JP | 2000-11417 | 1/2000 |
| JP | 2000-91685 | 3/2000 |
| JP | 2000-124524 | 4/2000 |
| JP | 2000-133863 | 5/2000 |
| JP | 2000-315832 | 11/2000 |
| JP | 2002-270933 | 9/2002 |
| JP | 2003-512735 | 4/2003 |
| JP | 2003-527741 | 9/2003 |
| JP | 2003-285186 | 10/2003 |
| JP | 2004-111542 | 4/2004 |
| JP | 2005-504437 | 2/2005 |
| JP | 2005-107412 | 4/2005 |
| WO | 03/026086 | 3/2003 |

OTHER PUBLICATIONS

Written Opinion of the ISA issued Oct. 24, 2006 in International (PCT) Application No. PCT/JP2006/315018.

Written Opinion of the IPEA issued Jun. 26, 2007 in International (PCT) Application No. PCT/JP2006/315018.

International Preliminary Report on Patentability issued Sep. 13, 2007 in International (PCT) Application No. PCT/JP2006/315018.

Sten Helmfrid et al., "Stable single-mode operation of intracavity-doubled diode-pumped Nd:YVO$_4$ lasers: theoretical study", Journal of Optical Society of America B, vol. 11, No. 3, Mar. 1994, pp. 436-445.

N. MacKinnon et al., "A laser diode array pumped, Nd:YVO$_4$/KTP, composite material microchip laser", Optics Communications 105 (1994) pp. 183-187.

* cited by examiner

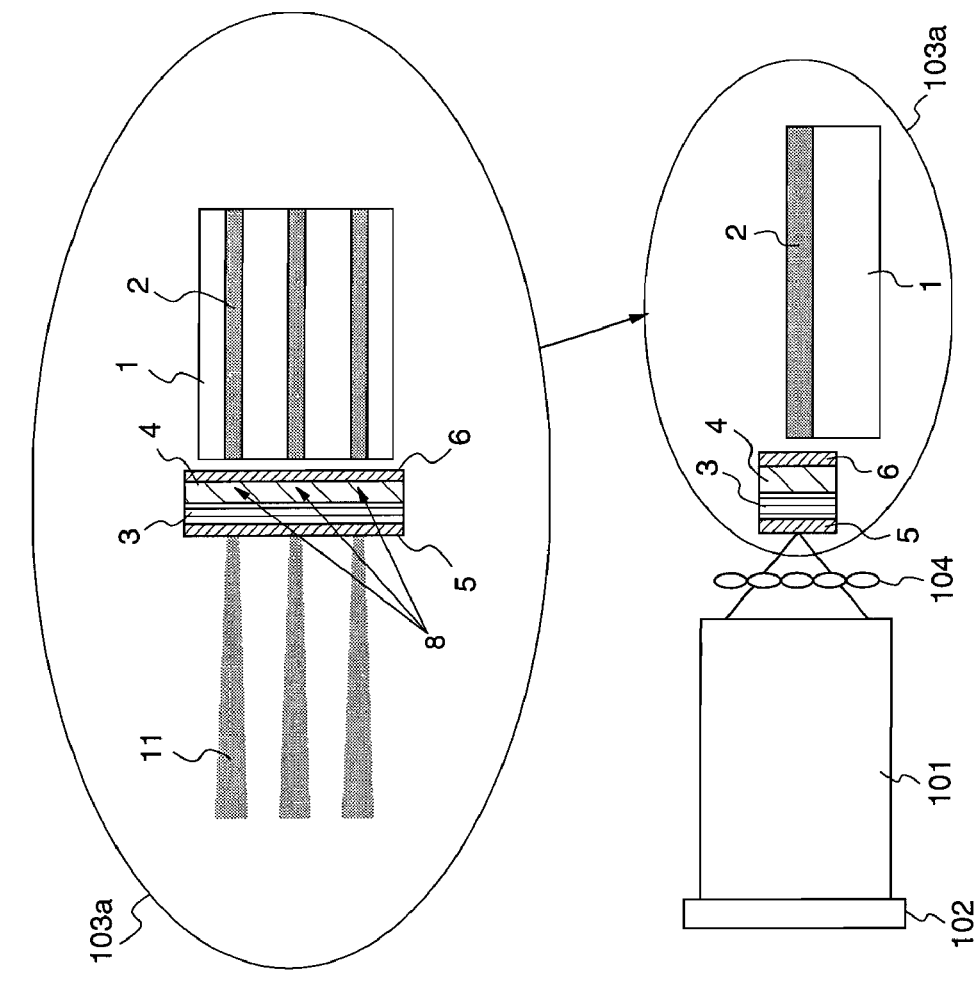

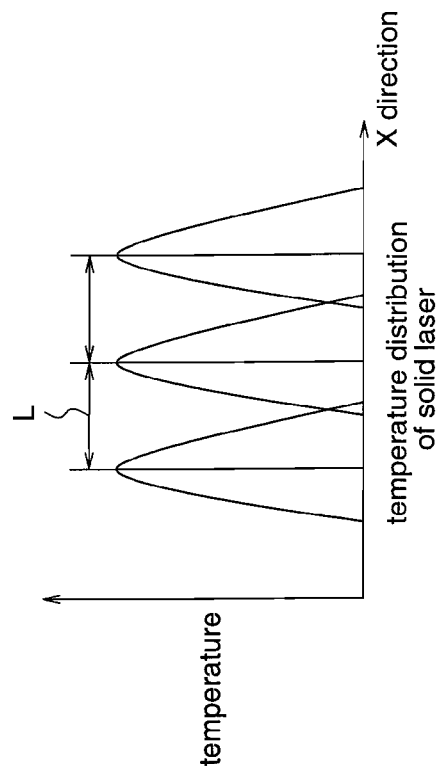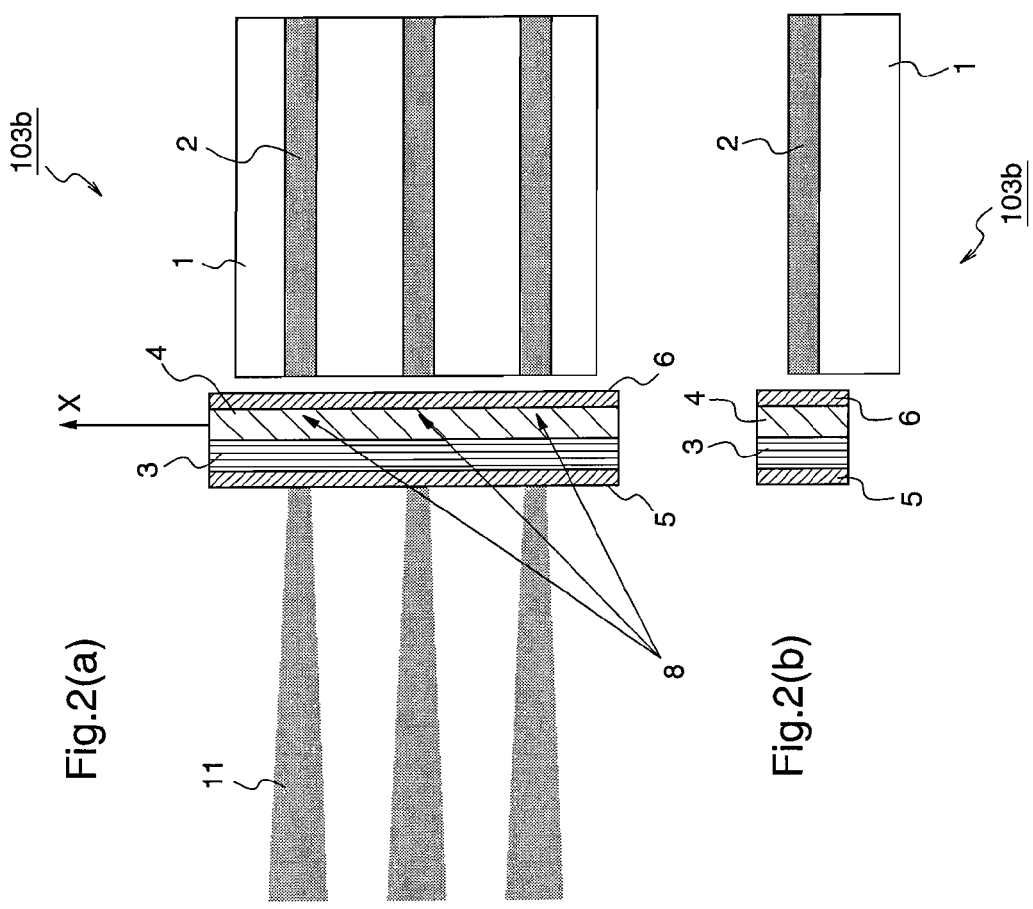

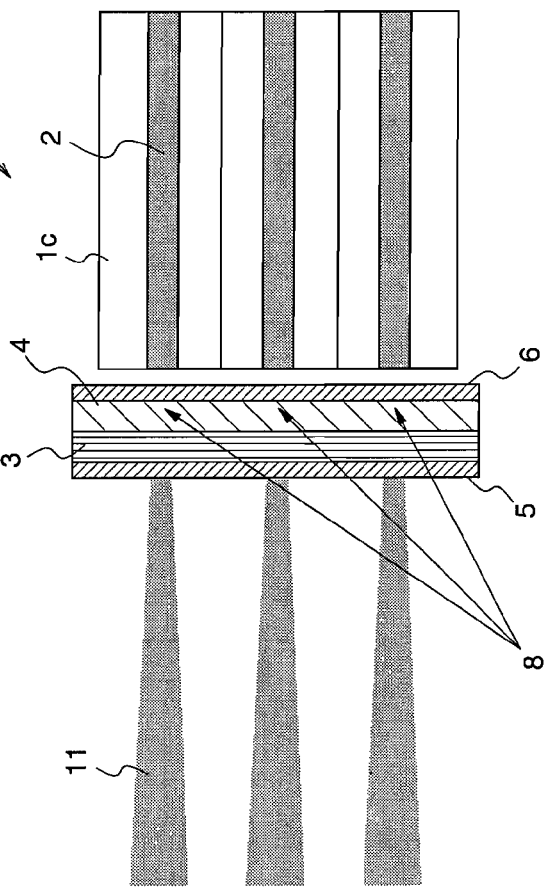
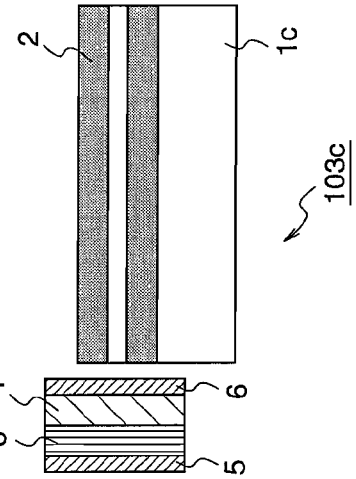
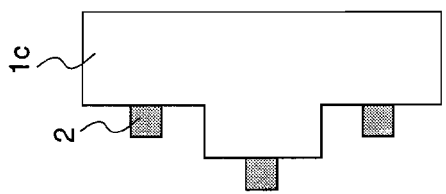

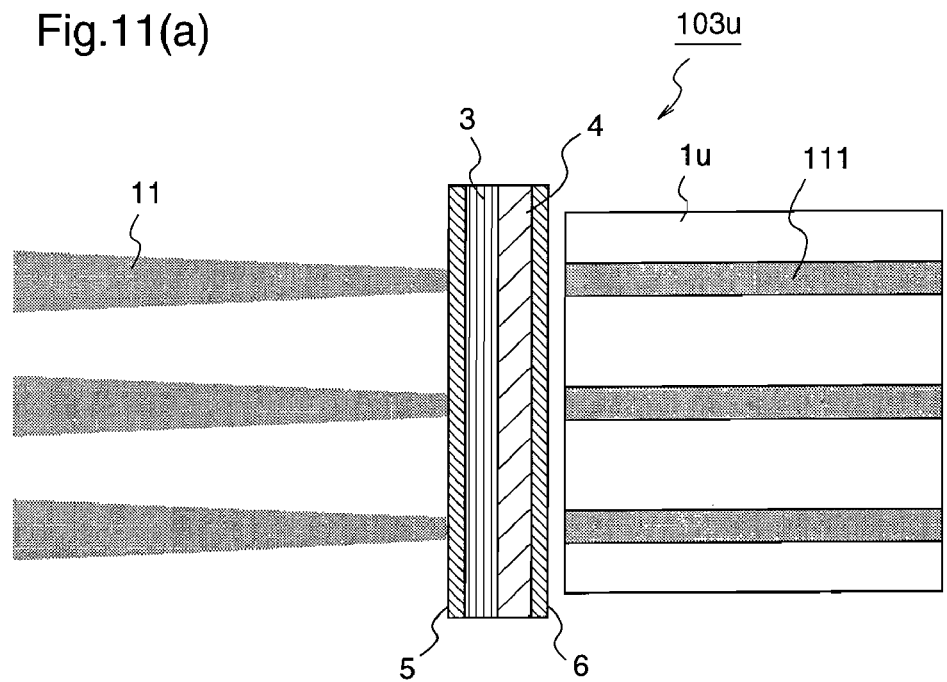
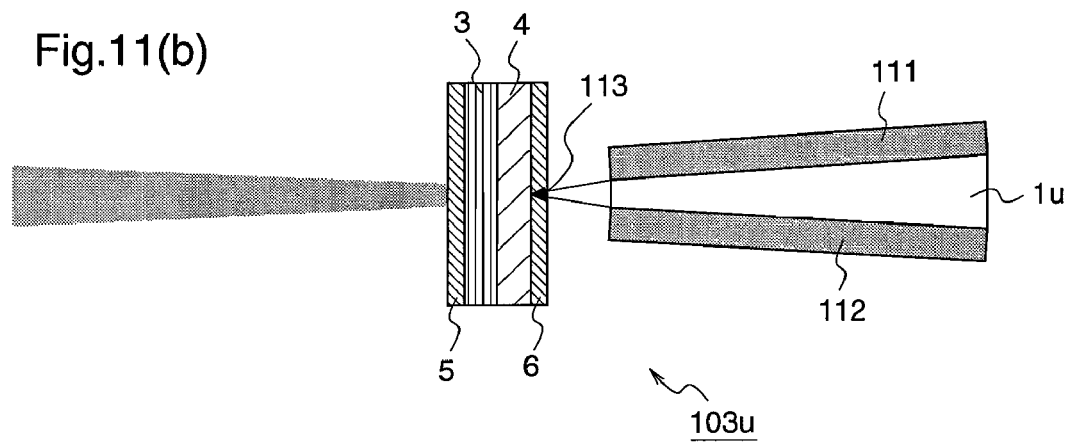

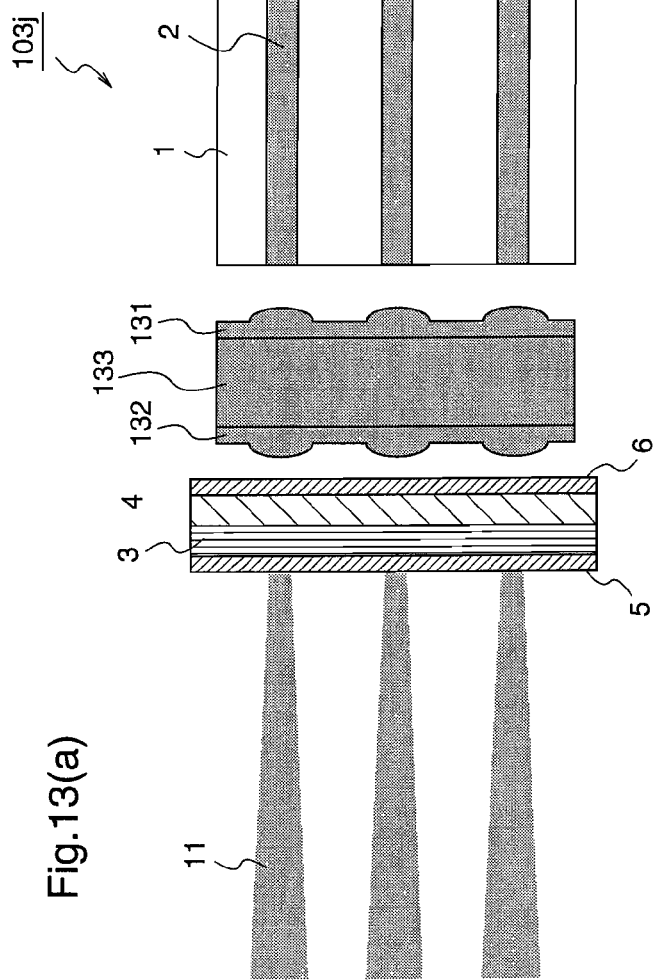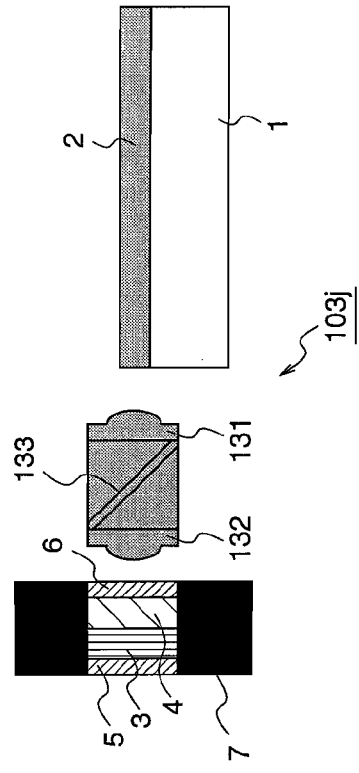

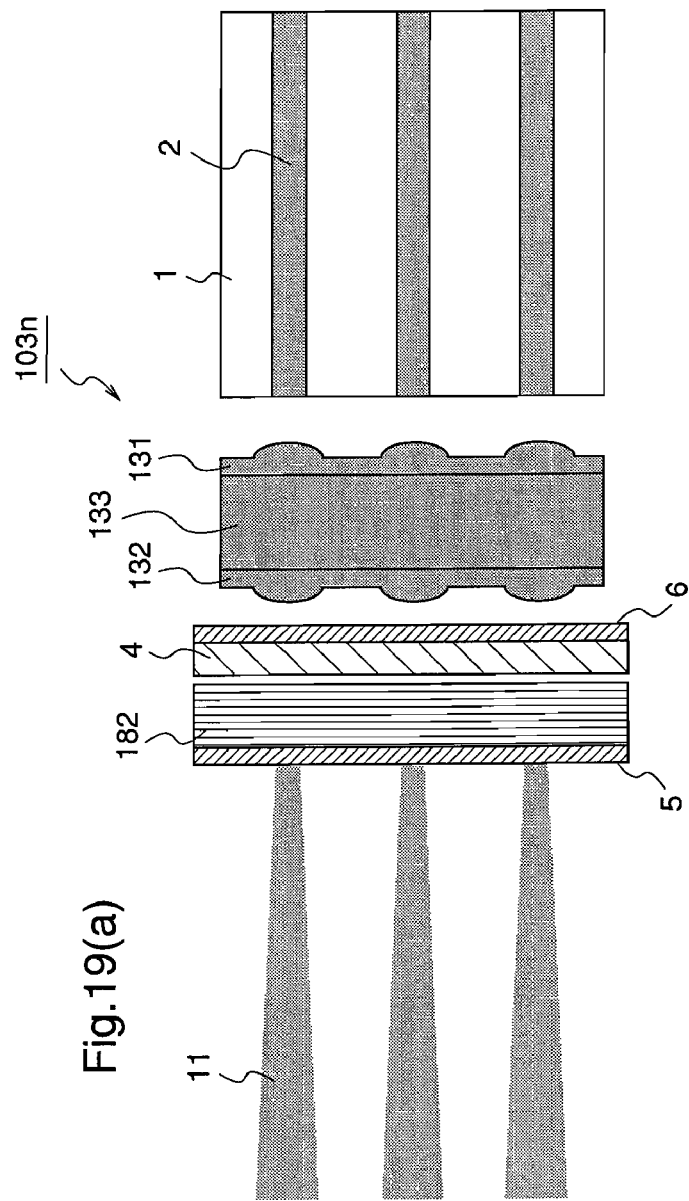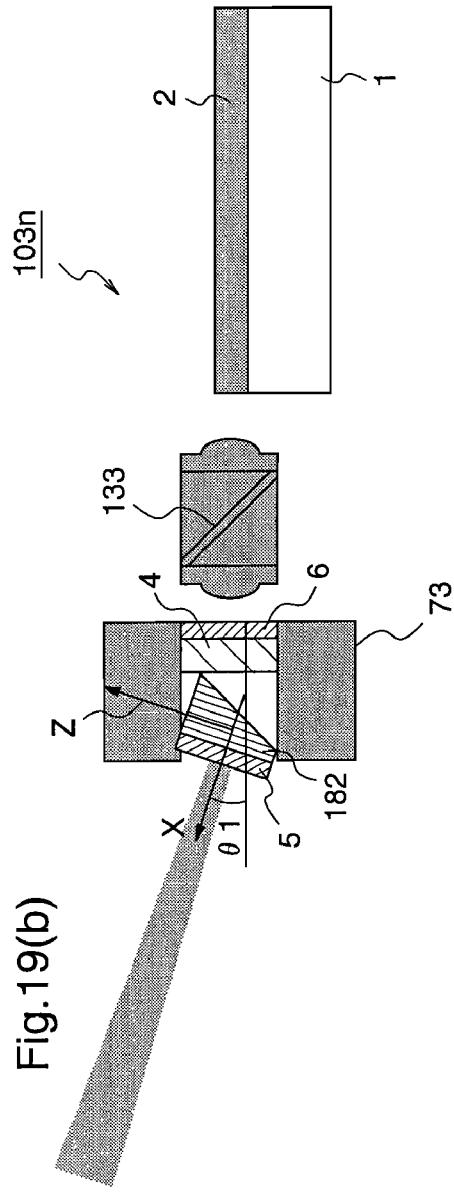

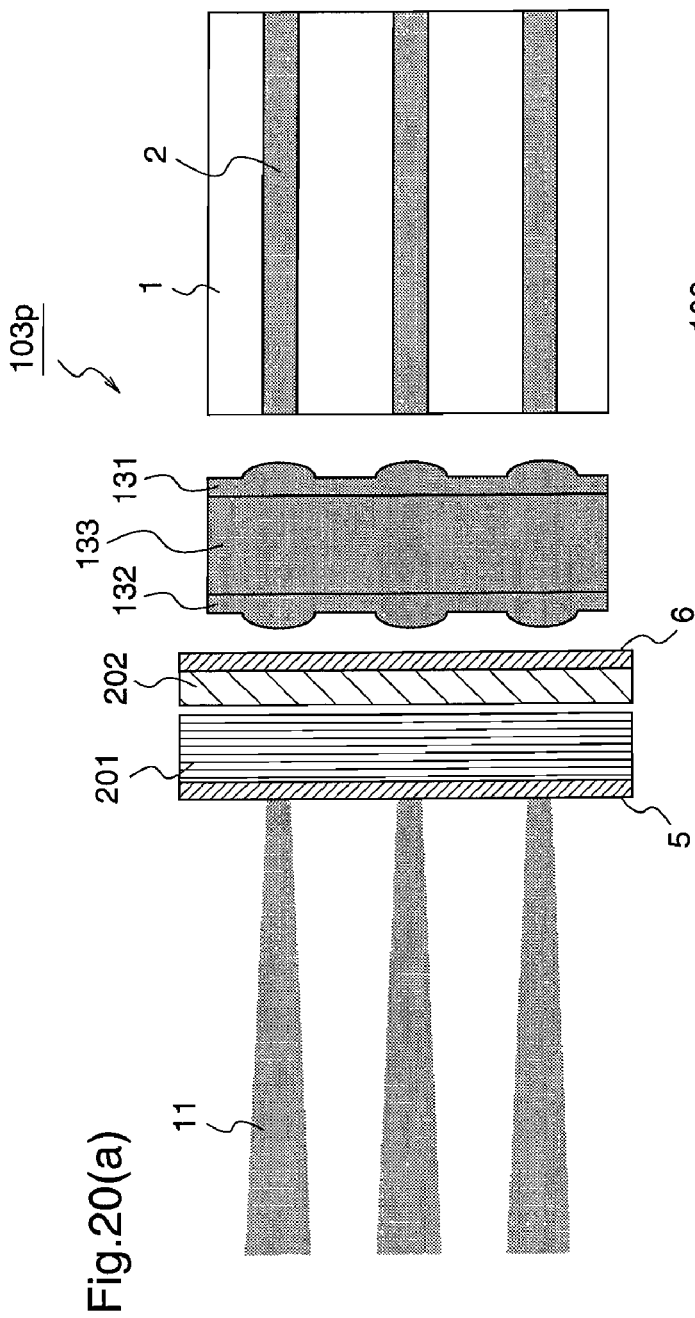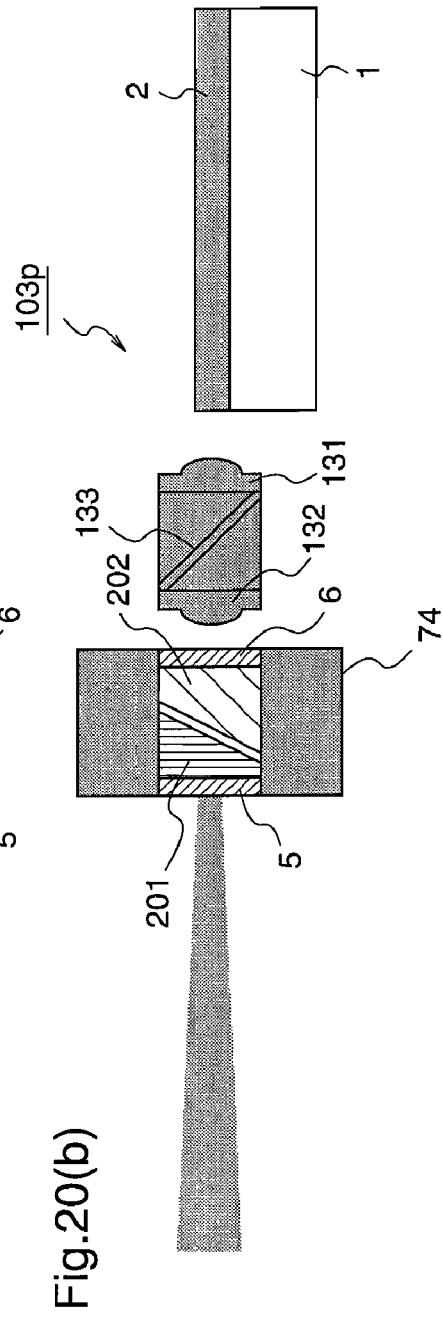
Fig.20(a)
Fig.20(b)

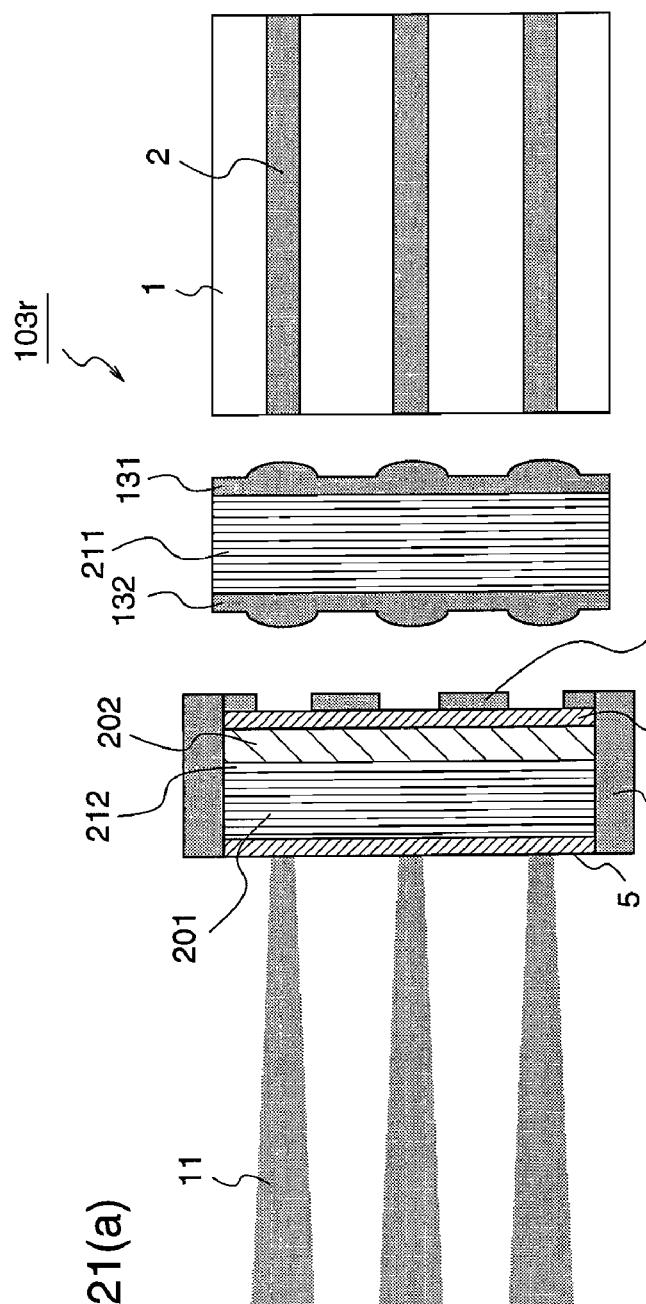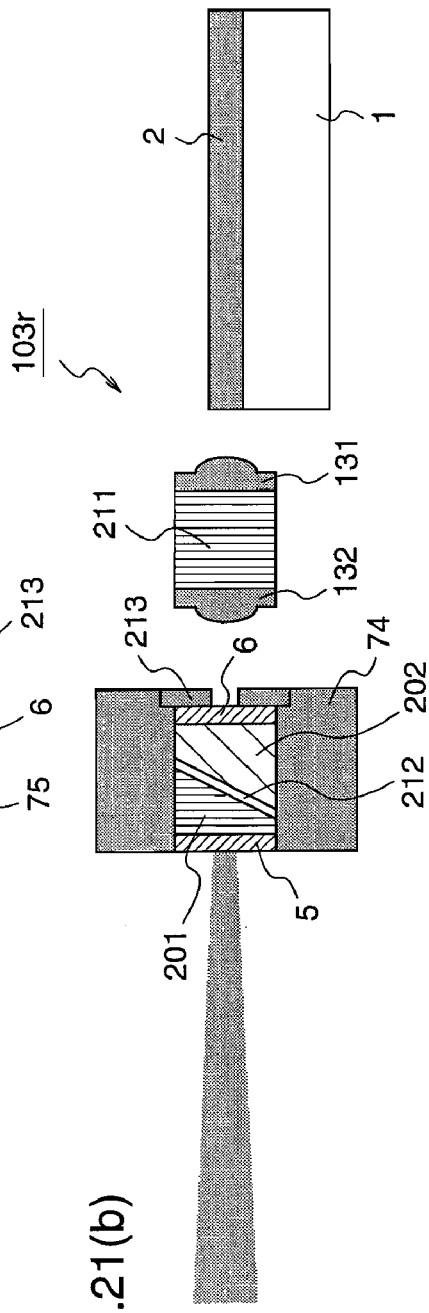
Fig.21(a)
Fig.21(b)

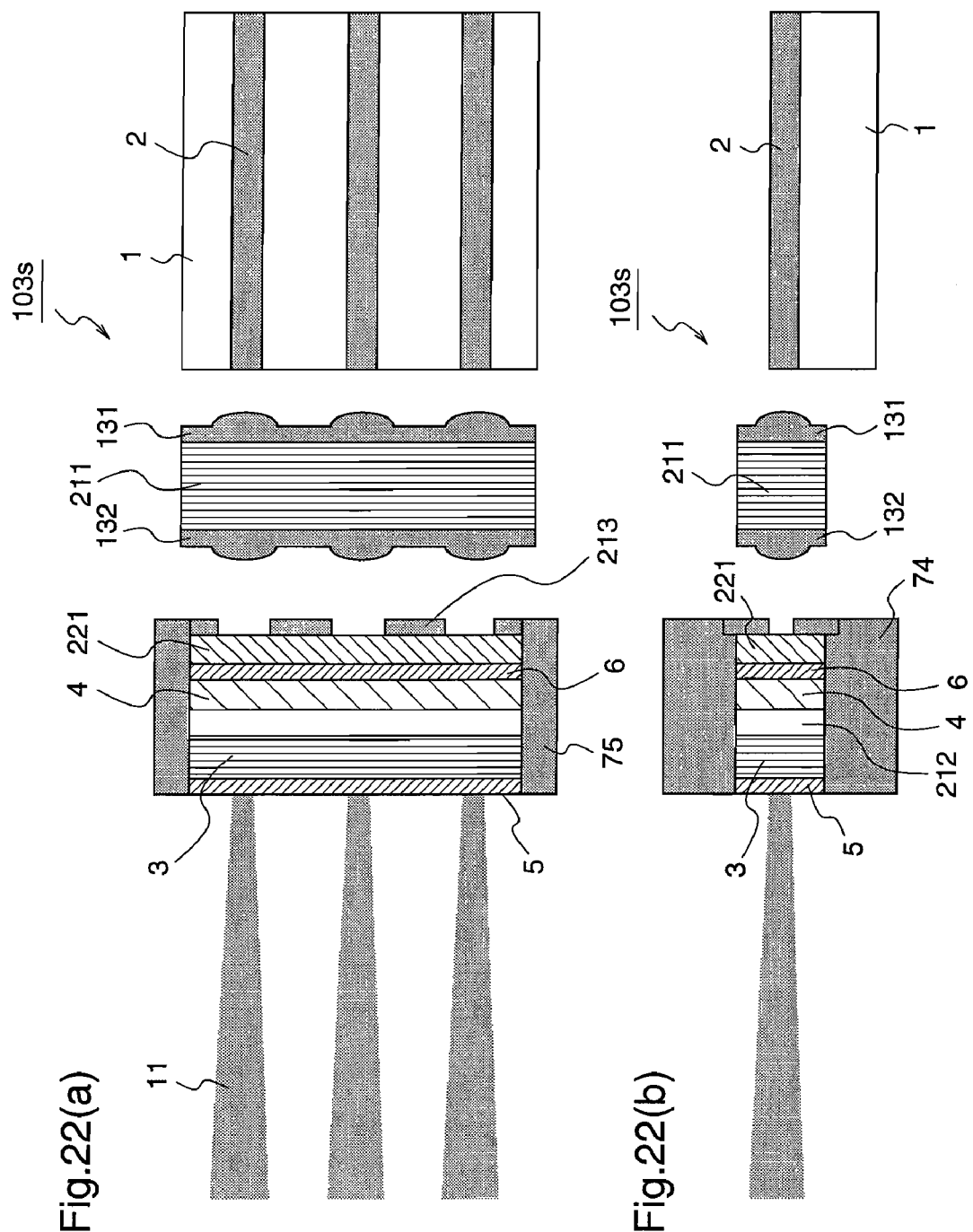

LASER LIGHT SOURCE AND DISPLAY DEVICE

TECHNICAL FIELD

The present invention relates to a laser light source and a display device, and more particularly, to a microchip laser light source which operates at high output power with stability, and a display device using the microchip laser light source.

BACKGROUND ART

A microchip laser using a solid laser realizes miniaturization of a light source. The microchip laser is a solid laser pumped by a semiconductor laser, and a resonator length thereof is reduced to about several mm. Generally, when the resonator length of the solid laser is reduced, output stability can be achieved as described in Non-patent Document 1. Further, there is a construction in which a microchip laser and a wavelength conversion element are combined to perform generation of green light (Non-patent Document 2). Furthermore, there is a construction in which a semiconductor laser array, a solid laser, and a nonlinear crystal are combined to perform generation of green light as described in Patent Document 1.

Further, Patent Document 2 discloses a method for increasing output power by a construction in which solid lasers are arranged in a two-dimensional array.

Patent Document 1: Japanese Published Patent Application No. 2004-111542

Patent Document 2: Japanese Published Patent Application No. Hei.9-246648

Non-patent Document 1: Journal of Optical Society of America B Vol. 11, pp 436-445, 1994

Non-patent Document 2: Optics Communications 105 (1994), pp 183-187

DISCLOSURE OF THE INVENTION

Problems to be Solved by the Invention

However, sufficient output stability cannot be obtained in the conventional construction where the solid laser pumped by the semiconductor laser and the wavelength conversion element are combined. Especially when external temperature change occurs, output fluctuation undesirably occurs due to unstable transverse mode in the solid laser resonator. Further, also in the wavelength conversion element, since a phase matching wavelength varies due to temperature rise, an output instability phenomenon due to heat undesirably occurs.

The present invention is made to solve the above-described problems and has for its object to provide a high-power laser light source which performs laser oscillation in a stable transverse mode.

Further, another object of the present invention is to realize a laser light source having a stable transverse mode and excellent high-power characteristics, as a laser light source for a laser display.

Measures to Solve the Problems

In order to achieve the above-mentioned objects, a laser light source according to the present invention comprises plural semiconductor lasers, a solid laser medium, a wavelength conversion element, a first reflection layer formed on one facet of the solid laser medium, and a second reflection layer formed on one facet of the wavelength conversion element, wherein the solid laser medium and the wavelength conversion element are disposed between the first reflection layer and the second reflection layer, the first reflection layer and the second reflection layer form a laser resonator having both reflection end facets approximately parallel to each other, plural pump parts of the solid laser medium are pumped by the plural semiconductor lasers, the plural pump parts are separated from each other by 300 µm or more, the solid laser medium comprises plural solid lasers having different compositions or materials, the wavelength conversion element has plural parts having different phase matches, and the solid lasers generate laser lights of different wavelengths for the respective pump parts.

Thereby, thermal influence between the adjacent pump parts is alleviated to perform laser oscillation in a stable transverse mode. Further, by making the respective laser crystals have slightly different compositions or the like, plural laser lights of different wavelengths can be generated to achieve a reduction in speckle noise.

A laser light source according to the present invention comprises three or more semiconductor lasers, a solid laser medium, a wavelength conversion element, a first reflection layer formed on one facet of the solid laser medium, and a second reflection layer formed on one facet of the wavelength conversion element, wherein the solid laser medium and the wavelength conversion element are disposed between the first reflection layer and the second reflection layer, the first reflection layer and the second reflection layer form a laser resonator having both reflection end facets approximately parallel to each other, three or more pump parts of the solid laser medium are pumped by the three or more semiconductor lasers, the three or more pump parts are arranged so as not to be positioned on the same straight line, the solid laser medium comprises plural solid lasers having different compositions or materials, the wavelength conversion element has plural parts having different phase matches, and the solid lasers generate laser lights of different wavelengths for the respective pump parts.

Thereby, thermal influence between the adjacent pump parts is alleviated to perform laser oscillation in a stable transverse mode. Further, by making the respective laser crystals have slightly different compositions or the like, plural laser lights of different wavelengths can be generated to achieve a reduction in speckle noise.

A laser light source according to the present invention comprises plural semiconductor lasers, a solid laser medium, a wavelength conversion element, a first reflection layer formed on one facet of the solid laser medium, and a second reflection layer formed on one facet of the wavelength conversion element, wherein the solid laser medium and the wavelength conversion element are disposed between the first reflection layer and the second reflection layer, the first reflection layer and the second reflection layer form a laser resonator having both reflection end facets approximately parallel to each other, plural pump parts of the solid laser medium are pumped by the plural semiconductor lasers, the plural pump parts are separated from each other by a heat separation mechanism, the solid laser medium comprises plural solid lasers having different compositions or materials, the wavelength conversion element has plural parts having different phase matches, and the solid lasers generate laser lights of different wavelengths for the respective pump parts.

Thereby, thermal influence between the adjacent pump parts is alleviated to perform laser oscillation in a stable transverse mode. Further, by making the respective laser crystals have slightly different compositions or the like, plural laser lights of different wavelengths can be generated to achieve a reduction in speckle noise.

Further, a laser light source according to the present invention comprises plural semiconductor lasers, a solid laser medium, a wavelength conversion element, a first reflection layer formed on one facet of the solid laser medium, and a second reflection layer formed on one facet of the wavelength conversion element, wherein the solid laser medium and the wavelength conversion element are disposed between the first reflection layer and the second reflection layer, the first reflection layer and the second reflection layer form a laser resonator having both reflection end facets approximately parallel to each other, plural pump parts of the solid laser medium are pumped by the plural semiconductor lasers, the plural pump parts are separated from each other by 300 μm or more, the solid laser medium comprises a ceramic material, at least one of the plural pump parts in the solid laser medium has a composition or a material different from those of other pump parts, the wavelength conversion element has plural parts having different phase matches, and the solid lasers generate laser lights of different wavelengths for the respective pump parts.

Thereby, thermal influence between the adjacent pump parts is alleviated to perform laser oscillation in a stable transverse mode. Further, since laser lights of different wavelengths are generated in the pump parts having different compositions or the like, a reduction in speckle noise can be achieved.

A laser light source according to the present invention comprises three or more semiconductor lasers, a solid laser medium, a wavelength conversion element, a first reflection layer formed on one facet of the solid laser medium, and a second reflection layer formed on one facet of the wavelength conversion element, wherein the solid laser medium and the wavelength conversion element are disposed between the first reflection layer and the second reflection layer, the first reflection layer and the second reflection layer form a laser resonator having both reflection end facets approximately parallel to each other, three or more pump parts of the solid laser medium are pumped by the three or more semiconductor lasers, the three or more pump parts are arranged so as not to be positioned on the same straight line, the solid laser medium comprises a ceramic material, at least one of the plural pump parts in the solid laser medium has a composition or a material different from those of other pump parts, the wavelength conversion element has plural parts having different phase matches, and the solid lasers generate laser lights of different wavelengths for the respective pump parts.

Thereby, thermal influence between the adjacent pump parts is alleviated to perform laser oscillation in a stable transverse mode. Further, since laser lights of different wavelengths are generated in the pump parts having different compositions or the like, a reduction in speckle noise can be achieved.

A laser light source according to the present invention comprises plural semiconductor lasers, a solid laser medium, a wavelength conversion element, a first reflection layer formed on one facet of the solid laser medium, and a second reflection layer formed on one facet of the wavelength conversion element, wherein the solid laser medium and the wavelength conversion element are disposed between the first reflection layer and the second reflection layer, the first reflection layer and the second reflection layer form a laser resonator having both reflection end facets approximately parallel to each other, plural pump parts of the solid laser medium are pumped by the plural semiconductor lasers, the plural pump parts are separated from each other by a heat separation mechanism, the solid laser medium comprises a ceramic material, at least one of the plural pump parts in the solid laser medium has a composition or a material different from those of other pump parts, the wavelength conversion element has plural parts having different phase matches, and the solid lasers generate laser lights of different wavelengths for the respective pump parts.

Thereby, thermal influence between the adjacent pump parts is alleviated to perform laser oscillation in a stable transverse mode. Further, since laser lights of different wavelengths are generated in the pump parts having different compositions or the like, a reduction in speckle noise can be achieved.

Further, in the above-described laser light source, the wavelength conversion element preferably comprises plural non-linear optical crystals. In this case, plural laser lights of different wavelengths can be generated by making the respective non-linear optical crystals have slightly different compositions or the like, thereby achieving a reduction in speckle noise.

Further, in the above-described laser light source, the wavelength conversion element preferably comprises one non-linear optical crystal. In this case, the construction of the wavelength conversion element can be simplified.

Further, in the above-described laser light source, at least either of compositions or materials of the plural solid laser crystals are preferably different from each other.

Further, in the above-described laser light source, preferably, three or more pump parts are provided, and intervals between the respective adjacent pump parts are different from each other. In this case, the temperatures in the respective pump parts can be made different from each other. Thereby, laser lights of different wavelengths are generated in the pump parts having different temperatures, and a reduction in speckle noise can be achieved.

Further, in the above-described laser light source, preferably, a heatsink is further provided, steps are formed on a surface of the heatsink, and at least some of the semiconductor lasers are mounted on the heatsink so as to be positioned at different levels due to the steps on the heatsink. In this case, the distance between the adjacent pump parts in the solid laser medium can be extended without changing the size of the solid laser medium.

Further, in the above-described laser light source, the semiconductor lasers and the solid laser medium preferably have heatsinks, respectively. In this case, heats generated in the solid laser and the semiconductor lasers can be sufficiently radiated to the outside, thereby realizing miniaturization of the laser light source.

Further, in the above-described laser light source, the heatsink of the semiconductor lasers and the heatsink of the solid laser medium are preferably separated from each other. In this case, thermal influence between the semiconductor lasers and the solid laser medium can be reduced, and thereby heat radiation effect is further enhanced.

Further, in the above-described laser light source, the laser resonator is preferably provided with heatsink parts which are disposed between the plural pump parts in the solid laser medium. In this case, thermal influence between the pump parts in the solid laser medium can be reduced, and thereby heat radiation effects of the pump parts are further enhanced.

Further, in the above-described laser light source, the laser resonator preferably has a heat separation layer which is disposed between the solid laser medium and the wavelength conversion element. In this case, thermal influence between the solid laser medium and the wavelength conversion element can be reduced, and thereby heat radiation effect is further enhanced.

Further, in the above-described laser light source, preferably, the plural pump parts of the solid laser medium have different temperatures in the respective oscillation states, and oscillate laser lights having different oscillation wavelengths or different oscillation spectrums due to the temperature differences. In this case, laser lights of different wavelengths are generated in the pump parts having different temperatures, thereby achieving a reduction in speckle noise.

Further, in the above-described laser light source, preferably, a light feedback element is further provided, and the oscillation wavelengths of the semiconductor lasers are fixed by the light feedback element. In this case, since the oscillation wavelength does not vary even when the external temperature varies, the solid laser medium can be pumped with stability, and thereby variation in the output power due to variation in the external temperature can be significantly reduced.

Further, in the above-described laser light source, the light feedback element is preferably a volume grating or a wavelength selection filter.

Further, in the above-described laser light source, preferably, a fiber array is further provided, and lights emitted from the plural semiconductor lasers are introduced into the solid laser medium through the fiber array, and pump the solid laser medium. In this case, the degree of freedom in arranging the pump semiconductor lasers can be increased.

Further, in the above-described laser light source, at least either of the solid laser medium or the wavelength conversion element preferably has an end facet that is inclined with respect to a light axis of pump light from the pump light source. In this case, stability of the output power can be enhanced by improving the polarization separation characteristics.

Further, in the above-described laser light source, an angle which is formed by the inclined end facet of either of the solid laser medium or the wavelength conversion element and the light axis of the pump light is preferably a Brewster angle with respect to the oscillation wavelength of the solid laser medium. In this case, stability of the output power can be enhanced by improving the polarization separation characteristics.

Further, in the above-described laser light source, preferably, the wavelength conversion element is a non-linear optical crystal, the non-linear optical crystal is $LiNbO_3$ containing any of Mg, Zn, In, and Sc, and having a periodic polarization inversion structure, and the thickness of the non-linear optical crystal is 1 mm or less. In this case, stable laser oscillation can be performed by reducing the resonator length.

Further, in the above-described laser light source, the period of the polarization inversion structure formed in the non-linear optical crystal preferably has a distribution in the non-linear optical crystal. In this case, it is possible to suppress that the phase matching condition partially varies due to the temperature distribution in the wavelength conversion element, by the distribution of the period of the polarization inversion structure.

Further, in the above-described laser light source, preferably, the solid laser medium is a solid laser crystal, and any opposed side facets of the solid laser crystal are nonparallel to each other. In this case, abnormal laser oscillation at between the both side facets of the solid laser medium can be suppressed.

Further, in the above-described laser light source, preferably, the solid laser medium is a solid laser crystal, and grooves are formed so as to be positioned between the respective adjacent pump parts, on an end facet of the solid laser crystal. In this case, abnormal laser oscillation in the solid laser medium in the pump part arrangement direction can be suppressed.

Further, in the above-described laser light source, the grooves formed on the end facet of the solid laser crystal are preferably nonparallel to a side facet of the solid laser crystal that is parallel to the light axis of the pump light. In this case, abnormal laser oscillation at between the both side facets of the solid laser medium can be further suppressed.

Further, in the above-described laser light source, the semiconductor lasers are preferably inclined so that the lights from the semiconductor lasers are diagonally incident on the end facet of the solid laser crystal. In this case, it is possible to prevent the light reflected at the light incident facet of the solid laser medium from returning to the active layers of the semiconductor lasers, thereby achieving output stability and long lifetime of the semiconductor lasers.

Further, in the above-described laser light source, the wavelength conversion element has a periodic polarization inversion structure, and the period of the polarization inversion structure has a partial distribution.

A laser light source according to the present invention comprises a pump light source, a solid laser medium, and a wavelength conversion element, wherein the solid laser medium is pumped by the pump light source to generate plural laser lights, the wavelength conversion element has plural wavelength conversion parts, the plural laser lights are converted into shorter-wavelength lights by the different wavelength conversion parts of the wavelength conversion element, the wavelength conversion parts are separated from each other by 100 µm or more, the wavelength conversion element is a non-linear optical crystal, the non-linear optical crystal is $LiNbO_3$ containing any of Mg, Zn, In, and Sc and having a periodic polarization inversion structure, and a length of a resonator including the laser medium and the non-linear optical crystal is 2 mm or less.

Thereby, thermal influence between the adjacent wavelength conversion parts in the wavelength conversion element is alleviated to perform wavelength conversion with stability, and the resonator length is reduced to realize stable laser oscillation. Further, it is possible to suppress that the phase matching condition partially varies due to the temperature distribution in the wavelength conversion element, by making the period of the polarization inversion structure have a distribution.

Further, in the above-described laser light source, the solid laser medium is preferably a fiber laser. In this case, the degree of freedom in arranging the pump light source, and the pump light source can be disposed sufficiently separated from the solid laser medium.

Further, in the above-described laser light source, a laser light emitted from the fiber laser is preferably divided into plural laser beams. In this case, plural pump parts can be generated in the solid laser medium by one pump light source.

Further, in the above-described laser light source, the solid laser medium preferably comprises plural fiber lasers. In this case, oscillation wavelengths and wavelength spectrums of laser lights generated in the respective pump parts can be easily varied by using the fiber lasers of different characteristics.

Further, in the above-described laser light source, at least one of laser lights from the plural fiber lasers preferably has a different oscillation wavelength or a different wavelength spectrum. In this case, speckle noise can be reduced.

Further, in the above-described laser light source, the wavelength conversion element preferably comprises plural non-linear optical crystals. In this case, plural laser lights of different wavelengths can be generated by making the respective non-linear optical crystals have slightly different compositions or the like, thereby achieving a reduction in speckle noise.

Further, in the above-described laser light source, the wavelength conversion element preferably comprises one non-linear optical crystal. In this case, the construction of the wavelength conversion element can be simplified.

Further, in the above-described laser light source, the period of the polarization inversion structure formed in the non-linear optical crystal preferably has a distribution in the non-linear optical crystal. In this case, it is possible to suppress that the phase matching condition partially varies due to the temperature distribution in the wavelength conversion element, by the distribution of the period of the polarization inversion structure.

A display device according to the present invention comprises the above-described laser light source, a collimating optical system, an averaging optical system, and a two-dimensional image conversion device, wherein plural laser beams emitted from the laser light source have an in-plane intensity distribution averaged by the averaging optical system, and converted into an image by the two-dimensional image conversion device.

Thereby, a high-definition display device capable reducing speckle noise can be realized.

Further, in the above-described display device, the averaging optical system is preferably constituted by a rod prism.

Further, in the above-described display device, preferably, an optical element is further provided, and at least one of deflection, phase, and polarization of a laser light incident on the rod prism is modulated by the optical element. In this case, speckle noise can be reduced by modulating deflection or the like of the laser light.

EFFECTS OF THE INVENTION

According to the laser light source of the present invention, the pump part in the solid laser can be divided into plural portions by pumping the solid laser with the plural semiconductor lasers, and moreover, influence of thermal lens effect that occurs in the solid laser can be controlled by arranging the plural pump parts separated from each other by a predetermined distance or more or arranging the pump parts so as not to be positioned on a straight line, thereby realizing stable and high-power multibeams.

Further, according to the laser light source of the present invention, the plural pump parts in the solid laser are separated from each other by the heat separation mechanism to suppress mutual interactions of laser oscillations at the plural pump parts, whereby stable beam outputs at the respective pump parts can be maintained, and consequently, a more stable light source can be realized.

Further, according to the laser light source of the present invention, the laser lights are wavelength-converted by the plural wavelength conversion parts, and the plural wavelength conversion parts are separated from each other by a predetermined distance, thereby generating high-power short wavelength lights.

Further, according to the present invention, optimum design for the solid laser resonator structure is performed to stabilize the output power, thereby realizing a resonator structure which can stabilize the output power with the longitudinal mode being further reduced.

Further, according to the present invention, it is possible to obtain a laser light source which can maintain oscillation of the solid laser with stability against external temperature variation.

Furthermore, output stabilization and reduction in speckle noise can be achieved simultaneously by using the laser light source of the present invention in a display device, thereby realizing a high-definition display.

BRIEF DESCRIPTION OF THE DRAWINGS

FIG. 1 is a diagram for explaining a laser light source according to a first embodiment of the present invention, wherein FIG. 1(a) is a top view thereof, and FIG. 1(b) is a configuration diagram of a display device using the laser light source.

FIG. 2 is a diagram for explaining a laser light source according to a second embodiment of the present invention, wherein FIG. 2(a) is a top view thereof, FIG. 2(b) is a side view thereof, and FIG. 2(c) is a diagram for explaining a temperature distribution of a solid laser in the laser light source.

FIG. 3 is a diagram for explaining the second embodiment, wherein

FIG. 4 is a diagram for explaining another example of a laser light source according to the second embodiment of the present invention, wherein FIG. 4(a) is a top view thereof, and FIGS. 4(b) and 4(c) are side views thereof.

FIG. 5 is a diagram for explaining a laser light source according to a third embodiment of the present invention, wherein

FIG. 6 is a diagram for explaining another example of a laser light source according to the third embodiment of the present invention, wherein

FIG. 7 is a diagram for explaining another example of a laser light source according to the third embodiment of the present invention, wherein

FIG. 8 is a diagram for explaining a laser light source according to a sixth embodiment of the present invention, wherein

FIG. 9 is a diagram for explaining a laser light source according to a tenth embodiment of the present invention, wherein

FIG. 10 is a diagram for explaining a laser light source according to an eleventh embodiment of the present invention, wherein

FIG. 11 is a diagram for explaining another example of a laser light source according to the eleventh embodiment of the present invention, wherein FIG. 11(a) is a top view thereof, and FIG. 11(b) is a side view thereof.

FIG. 13 is a diagram for explaining a laser light source according to a fifth embodiment of the present invention, wherein FIG. 13(a) is a top view thereof, and FIG. 13(b) is a side view thereof.

FIG. 15 is a diagram for explaining a laser light source according to a fourth embodiment of the present invention, wherein

FIG. 16 is a diagram for explaining a laser light source according to a twelfth embodiment of the present invention, wherein

FIG. 18 is a diagram for explaining a laser light source according to a seventh embodiment of the present invention, wherein

FIG. 19 is a diagram for explaining a laser light source according to an eighth embodiment of the present invention, wherein FIG. 19(a) is a top view thereof, and FIG. 19(b) is a side view thereof.

FIG. 20 is a diagram for explaining a laser light source according to a ninth embodiment of the present invention, wherein FIG. 20(a) is a top view thereof, and FIG. 20(b) is a side view thereof.

FIG. 21 is a diagram for explaining another example of a laser light source according to the tenth embodiment of the present invention, wherein FIG. 21(a) is a top view thereof, and FIG. 21(b) is a side view thereof.

FIG. 22 is a diagram for explaining another example of a laser light source according to the tenth embodiment of the present invention, wherein FIG. 22(a) is a top view thereof, and FIG. 22(b) is a side view thereof.

DESCRIPTION OF REFERENCE NUMERALS

Figure 3A:
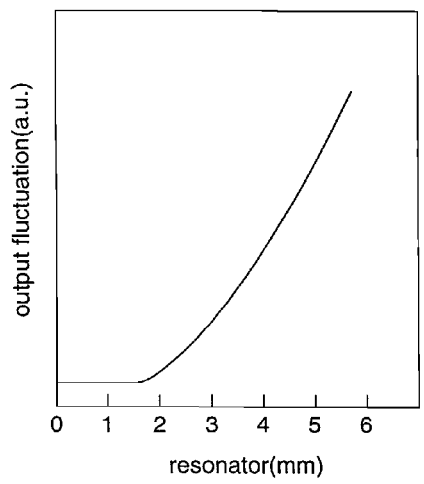
FIG. 3(a) is a cause-and-effect diagram illustrating the relationship between resonator length and output fluctuation of laser output.

1 . . . heatsink
2 . . . semiconductor laser
3 . . . non-linear optical material
4 . . . solid laser
5 . . . reflection coat
6 . . . reflection coat
7,74,75 . . . heatsink
8 . . . pump part
10 . . . volume grating
11 . . . laser light
12 . . . heat separation layer
101 . . . rod prism
102 . . . SLM
103a~103c,103g,103i~103k,103m,103n,103p~103v . . . laser light source
104 . . . optical element
105 . . . lens
111 . . . semiconductor laser
112 . . . semiconductor laser
113 . . . pump part
121,122,123,124 . . . side surface
125 . . . pump part
126 . . . laser oscillation
127 . . . groove
131,132 . . . microlens array
133 . . . wavelength filter
141,142,143 . . . pump part
144 . . . laser crystal A
145 . . . laser crystal B
146 . . . laser crystal C
151 . . . core
152 . . . semiconductor laser
153 . . . fiber
154 . . . fiber array
161 . . . fiber
164,165 . . . reflection coat
166 . . . conversion part
167 . . . pump light source
168 . . . fiber laser
171 . . . fiber
172,173 . . . non-reflection coat
181,182 . . . non-linear material
201 . . . non-linear material
202 . . . solid laser
211 . . . volume grating
212 . . . heat separation layer
213 . . . heatsink
221 . . . transparent heatsink
2000 . . . display device
2001 . . . green light source
2002 . . . blue light source
2003 . . . red light source
2004 . . . dichroic mirror
2005 . . . scanning mirror
2006 . . . diffuser plate
2007 . . . field lens
2008 . . . SLM
2009 . . . projection lens

BEST MODE TO EXECUTE THE INVENTION

Hereinafter, embodiments of the present invention will be described in detail with reference to the drawings.

Embodiment 1

FIG. 1 is a diagram for explaining a laser light source according to a first embodiment of the present invention, wherein FIG. 1(a) is a top view thereof, and FIG. 1(b) is a configuration diagram of a display device using the laser light source.

The laser light source 103a according to the first embodiment comprises a plurality of semiconductor laser chips 2 (hereinafter also referred to as semiconductor lasers), a solid laser 4, and a non-linear material 3 as a wavelength conversion element. The solid laser 4 generates a plurality of laser lights when pumped by the semiconductor lasers, the non-linear material has a plurality of wavelength conversion parts, the plural laser lights are converted into short-wavelength lights by the different wavelength conversion parts of the non-linear material, and the wavelength conversion parts are separated from each other by 100 μm or more.

As shown in FIG. 1(a), in the laser light source 103a of the first embodiment, the plural semiconductor lasers 2 are fixed by solder onto a heatsink 1. The plural semiconductor lasers 2 are arranged at constant intervals, and each semiconductor laser 2 has an oscillation wavelength about 808 nm.

Next, the operation and functional effect will be described.

The lights emitted from the respective semiconductor lasers 2 pump the solid laser 4. At this time, plural pump parts 8 to be pumped by the lights from the respective semiconductor lasers 2 in the solid laser 4 are separated from each other by 100 µm or more. The solid laser 4 generates lights each having a wavelength of about 1.06 µm, and the non-linear material 3 disposed on the light emission side of the solid laser 4 converts the lights generated in the solid laser 4 into laser lights 11 each having a wavelength of 0.53 µm. The non-linear material 3 is a non-linear optical crystal, and constitutes a wavelength conversion element. In the wavelength conversion element, the laser lights are converted into short-wavelength lights by the different wavelength conversion parts, and the wavelength conversion parts are separated from each other by 100 µm or more. Further, the solid laser 4 and the non-linear material 3 are sandwiched by reflection coats 5 and 6, thereby forming a resonator structure, and the solid laser pumped by the semiconductor lasers causes laser oscillation in the resonator. The oscillated laser lights are wavelength-converted into higher harmonics by the non-linear material 3, thereby generating green lights as the laser lights 11 having a wavelength of 0.53 µm.

A display using this laser light source is shown in FIG. 1(b). In FIG. 1(b), the light emitted from the laser light source 103a passes through an optical element 104, and thereafter, enters a rod prism 101. The light incident on the rod prism 101 is subjected to shaping of its intensity distribution into a rectangle in the rod prism, and thereafter, it is image-converted by a SLM 102 which is a two-dimensional image conversion switch and then injected by a lens 105.

The reason why the laser light source of the present invention is effective for a display device is because it is excellent in the following two points.

One point is its high-power and high-stable characteristics, and the other point is less speckle noise.

Hereinafter, reduction of speckle noise will be described in detail, while the high-power and high-stable characteristics will be described later for the features of the laser light source.

The speckle noise is a phenomenon that interference patterns of coherent light such as laser light occurs, and the speckle noise causes deterioration of image quality when laser light is applied to a display or the like. In order to reduce this problem, the optical element 104 is adopted in the display construction of the present invention. The optical element is a micro structure element having a variable refractive index, wherein a liquid crystal is confined in a structure having a predetermined planar pattern, and an AC current is applied to temporally vary the refractive index, whereby deflection and phase of light passing through the optical element 104 is varied. This construction enables reduction of speckle noise in laser light. This speckle noise reduction is based on a method of temporally changing the interference patterns, that is, the plural interference patterns are averaged by changing the plural patterns at a high speed so as to be recognized as a smooth image by human eyes. In this method, the laser light source of the present invention is effective. Since this laser light source has a multibeam structure and plural beams, i.e., output laser lights, are separated from each other by a predetermined distance, the laser lights are incident on the rod prism 101 at different angles. When the lights from the plural laser light sources are incident on the prism at different angles, the interference patterns of the lights on the screen are complicated and thereby speckles are multiplexed to enhance the speckle suppression effect.

Further, a method of emitting plural laser lights with different frequencies is also effective for changing the interference patterns. In this case, the frequencies of the plural laser lights must be sufficiently shorter than the frequency for switching the image, and it can be realized by modulating the laser lights from the pump semiconductor lasers 2.

Further, the two reflection coats 5 and 6 of the solid laser are designed such that the reflection coat 6 totally reflects the green light while the other reflection coat 5 transmits the green light. Thereby, the laser light 11 becomes a sum of the light that is directly outputted from the non-linear optical crystal 3 and the light that is once reflected at the reflection coat 6. Accordingly, each laser beam is composed of two beams, and the intensity distributions of these beams are shaped in the rod prism to constitute more complicated interference patterns, thereby reducing the speckle noise effectively.

Further, the distance between the wavelength conversion parts in the wavelength conversion element is important for high output power.

MgO-doped $LiNbO_3$, $LiTaO_3$, or KTP, or a stoichometric material system thereof are able to perform highly efficient wavelength conversion by its high non-linearity. However, when generating visible light by second harmonic generation with an output exceeding 1 W, a phenomenon that the output becomes unstable was discovered. This is caused by that ultraviolet light having a wavelength of 400 nm or less is generated by third harmonic generation due to the generated visible light and the fundamental wave, and thereby absorption of the visible light increases. That is, heat is generated due to absorption of the generated visible harmonic, and the conversion efficiency varies temporally and partially, whereby the output power becomes unstable. In order to prevent this phenomenon, it is important to restrict generation and output of the visible light in the conversion part in the wavelength conversion element by dividing the conversion part into plural portions, and to suppress heat generated in the conversion part by maintaining a sufficient interval between the adjacent wavelength conversion portions.

First of all, generation of visible light in the conversion part must be reduced to several W or lower. It was found that instability of output power and deterioration of conversion efficiency with time can be inhibited by reducing the visible light to 1~2 W or lower including reliability. On the other hand, it was experimentally verified that the wavelength conversion parts are preferably separated from each other by 100 µm or more. In the experiment, $MgO:LiNbO_3$ crystal was used, and green lights having wavelengths of about 530 nm were generated in two wavelength conversion parts. In this case, when the distance between the conversion parts became 50 µm or less, only 2 W or less in total was obtained as a stable maximum output. This is because the output power became unstable due to that heat generations in the conversion parts affected each other. When the distance between the conversion parts was 100 µm or more, stable output power was obtained even with a maximum output power being 3 W or more in total. Further, even after a tolerance experiment for several hundred hours, the conversion efficiency and the output power were not changed. It became apparent from this result that the interval between the conversion parts is preferably 100 µm or more.

Further, when the fundamental wave is wavelength-converted using plural crystals, there occurs no thermal influence between the crystals. In this case, it is only necessary to reduce the intensity of the visible light generation to several W or less in one crystal.

Further, the display device using the laser light source comprising plural laser beams according to the present invention can achieve high reliability. By preparing plural pump semiconductor lasers and plural solid laser parts, even if one of the lasers is deteriorated, other lasers can compensate for the output power of the deteriorated laser. Therefore, the laser light source of the present invention is effective to increase the lifetime and reliability of the display. Further, as for the laser light source, the entire lifetime is increased by giving a margin to the maximum value that can be outputted from one light source. Further, even if any of the lasers is deteriorated, the luminance can be maintained by increasing other laser outputs. Further, spare lasers may be prepared to compensate for the entire output power when one of the lasers is deteriorated. In this way, by adopting the multibeam structure, the reliability of the display light source can be significantly increased.

As described above, the laser light source 103a according to the first embodiment is provided with the plural semiconductor lasers 2, the solid laser 4, the non-linear material 3 constituting the wavelength conversion element, the reflection coat 5 formed on one facet of the solid laser, and the reflection coat 6 formed on one facet of the non-linear material 3, and the plural laser lights are converted into short-wavelength lights by the different wavelength conversion parts of the wavelength conversion element, and the wavelength conversion parts are separated from each other by 100 µm or more. Therefore, thermal influence between the adjacent wavelength conversion parts is reduced to perform wavelength conversion with stability.

Embodiment 2

FIG. 2 is a diagram for explaining a laser light source according to a second embodiment of the present invention, wherein FIG. 2(a) is a top view thereof, FIG. 2(b) is a side view thereof, and FIG. 2(c) is a diagram for explaining a temperature distribution of a solid laser.

In FIG. 2, reference numeral 103b denotes a laser light source according to the second embodiment. The laser light source 103b comprises plural semiconductor lasers 2, a solid laser 4, a non-linear material 3 constituting a wavelength conversion element, a reflection coat 5 formed at one surface of the solid laser, and a reflection coat 6 formed at one surface of the non-linear material 3. The solid laser and the wavelength conversion element are disposed between the both reflection coats, the reflection coats are disposed approximately parallel to each other to constitute a laser resonator, plural pump parts 8 of the solid laser are pumped by the plural semiconductor lasers, and the plural pump parts 8 are separated from each other by 300 µm or more.

The semiconductor lasers 2 are fixed onto a heatsink 1. The solid laser 4 and the non-linear optical material 3 are connected, and the reflection coat 5 is formed on a light emitting facet of the non-linear material 3 while the reflection coat 6 is formed on a light incident facet of the solid laser 4, thereby constituting a laser resonator.

Next, the operation and functional effect will be described.

Laser lights (wavelength: 808 nm) emitted from the semiconductor lasers 2 pump the solid laser 4, and the solid laser 4 generates lights having wavelengths of about 1.06 µm. These 1.06 µm lights are wavelength-converted by the non-linear optical material 3 in the laser resonator, and outputted to the outside as green laser lights having wavelengths of 0.53 µm. The solid laser and the non-linear optical material are composed of the same material to simplify the structure. Further, a high output power can be realized by increasing beam spots emitted from the laser resonator.

In order to oscillate such solid laser with stability, it is necessary to stabilize laser oscillation in the resonator, and it is important to stabilize the longitudinal mode and transverse mode of laser oscillation.

The longitudinal mode is a lot of oscillation spectrums in the laser resonator, and becomes unstable when it becomes multimode and thereby the oscillation spectrums increase. The microchip laser suppresses the oscillation mode by reducing the resonator length to stabilize the output power. Actually, it is possible to suppress multimode generation by reducing the optical length of the laser resonator to 4 mm or less. FIG. 3(a) shows the result of experiment for stability of the output power with the resonator length being varied. When the resonator length exceeds 2 mm with the refractive index of the laser medium being about 2, the optical length exceeds 4 mm, and output fluctuation increases.

Figure 3B:
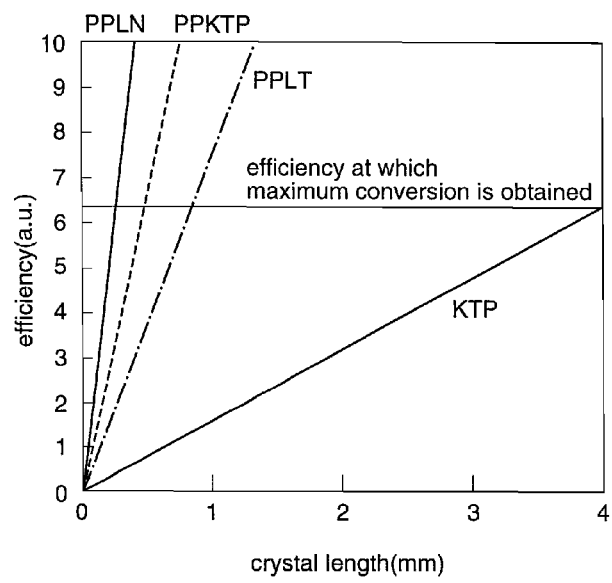
FIG. 3(b) is a cause-and-effect diagram illustrating the relationship between crystal lengths of various non-linear materials and efficiency.

On the other hand, the solid laser and the non-linear optical crystal are necessary for the laser resonator, and the length of the resonator comprising them must be reduced to 2 mm or less. However, since the length of the wavelength conversion element comprising the non-linear crystal is proportional to the conversion efficiency, the conversion efficiency is degraded when the element is shortened. FIG. 3(b) shows the relationships between the conversion efficiencies of highly-efficient non-linear materials and the element lengths (crystal lengths). Assuming that the output of the pumped solid laser is about 1 W, in order to obtain a maximum conversion efficiency, a crystal length as long as a value with which the maximum conversion efficiency shown in FIG. 3(b) can be obtained is required.

As for the crystal length at this time, 4 mm is required for KTP, 0.8 mm for $LiTaO_3$(PPLT) in which a periodic polarization inversion structure is formed, 0.5 mm for KTP(PP-KTP) in which a periodic polarization inversion structure is formed, and 0.25 mm for $LiNbO_3$(PPLN) in which a periodic polarization inversion structure is formed. Since the crystal length of the solid laser is about 0.5 mm, in order to reduce the resonator length to 2 mm or less, the maximum efficiency cannot be obtained with the conventionally used KTP. Stable output characteristics were obtained only when the crystals having the periodic polarization inversion structure such as PPLT, PPKTP, or PPLN were used.

Among the crystals, PPLN has a very high conversion efficiency, and thereby the resonator length can be reduced and the highest stability and efficiency characteristics can be achieved. However, PPLN has a problem of optical damage, and it is difficult to obtain high-power green light with stability. In order to solve this problem, Mg-doped $LiNbO_3$ was used. Then, the problem of optical damage was resolved, and a resonator length of 1 mm or less including the length of the solid laser crystal was realized. Therefore, the stability of the output power was significantly enhanced, and stable operation was achieved against external temperature change.

Further, since the laser light source of the present invention adopts the resonator structure in which laser oscillation is performed between the planar reflection coats, the loss in the resonator is greatly affected by the resonator length. By setting the resonator length to 2 mm or less, the resonator loss is reduced, and high efficiency is achieved.

Further, a crystal having a periodic polarization inversion structure is adopted as the non-linear material. The phase matching wavelength of the non-linear optical crystal is determined according to the polarization inversion period. In the construction where plural pump parts of the solid laser are provided and simultaneously pumped, temperature rise occurs in the solid laser. This temperature rise occurs in each pump part, and thereby a temperature distribution occurs between the respective pump parts. To be specific, the pump part positioned near the center of the non-linear optical crystal has a higher temperature than that positioned at an end of the crystal. Since this temperature is propagated to the nonlinear optical crystal, the phase matching condition of the non-linear optical crystal partially varies, and thereby the total conversion efficiency is degraded. In order to solve this problem, it is desired to design the polarization inversion period so as to have a partial distribution in the non-linear optical crystal. Since the center portion of the non-linear optical crystal will be increased in temperature, the polarization inversion period in the center portion should be shorter than that in the peripheral portion.

On the other hand, stability of the transverse mode is important for output stability. Therefore, in the present invention, the pump parts are separated from each other so that the laser oscillations in the solid laser are independent from each other and do not interfere with each other. Since the microchip laser uses the resonator in which laser oscillation occurs between the planar reflection coats, stability and low loss of the resonator are secured by utilizing the thermal lens effect of the pumped solid laser parts. Therefore, if the pump parts in the solid laser optically and thermally interfere with each other, the oscillation becomes unstable. Further, if the pump parts interfere with each other, since the light beam spots in the resonator are expanded, the conversion efficiency in the non-linear optical crystal is degraded. Therefore, it is necessary to sufficiently reduce the interference in the transverse direction in the resonator.

FIG. 2(c) shows the temperature distribution in the transverse direction in the solid laser. As shown in the figure, temperature rise occurs around the pumped spot in each pump part. When this temperature distribution is separated in the transverse direction, generation of thermal lenses in the respective pump parts can be stabilized. According to our inspection, when the width of the active layer of the pump semiconductor laser is about 50 μm, stable oscillation was confirmed with the interval of the pump parts being 200 μm or more. When the active layer is 100 μm, an interval of 250 μm or more is required. The width of the active layer of the semiconductor laser is preferably 100 μm or less, and more preferably, it should be 50 μm or less. The width of the active layer determines the size of the pump part of the solid laser, and determines the size of the transverse mode that is oscillated in the solid laser. When the transverse mode is large, the power density in the resonator is decreased and thereby the efficiency of wavelength conversion is significantly degraded. Therefore, the width of the active layer is preferably 50 μm. When a Nd:YVO$_4$ substrate is used as a laser medium and the thickness of the substrate is 0.5 mm, the temperature distribution of the pumped spot becomes a mountain-shaped distribution of about 300 μm in full width at half maximum. In order to prevent the peak temperature of each pumped part from increasing due to influence of the adjacent pumped part, the interval between the respective pump parts is desirably set to at least 300 μm.

The laser light source having the construction according to the second embodiment is fabricated. Three stripe-shaped lasers each having an output of 1 W are used as the semiconductor lasers, the width of the active layer is 50 μm, and the respective semiconductor lasers are fixed onto a heatsink with an interval between them being 200 μm. The solid laser comprises Nd:YO$_4$, and the crystal length thereof is 0.5 mm. The non-linear crystal comprises Mg-doped LiNbO$_3$ having a periodic polarization inversion structure, and the crystal length thereof is 0.5 mm. In this construction, the output power of green light from each beam is 0.3 W, and green lights of 0.9 W in total are generated. The output power is stable, and unstability due to variations in the mode or the like is not observed. Since the output power is about 0.1 W for one beam in the conventional construction using KTP, significant increase in the output power and stability are confirmed.

This result indicates that the problem of the conventional array type semiconductor laser is remedied by the construction of the present invention, while the conventional array type semiconductor laser has the problem that, in the solid laser pumped by the respective semiconductor lasers, the pump parts interfere with each other and thereby laser oscillation becomes unstable, and further, mode expansion occurs in the solid laser, which causes a reduction in the efficiency of wavelength conversion.

Even when LiNbO$_3$ to which In, Zn, Sc or the like is doped was used as the non-linear crystal instead of Mg-doped LiNbO$_3$, resistance to optical damage is increased and high-power output is achieved. Another feature of PPMgLN is that it does not cause a phenomenon of gray track that occurs in KTP. In KTP, when generation of high-power variable light exceeding 100 mW is performed for long hours, there occurs a phenomenon of gray track in which a color center appears in the crystal and thereby characteristics are deteriorated. In contrast to KTP, PPMgLN causes no color center even with an output power of about 1 W, and high reliability is obtained, resulting in a highly-reliable light source.

Nd:YVO$_4$ or Nd:GdVO$_4$ is preferable for the solid laser. Since the doping amount of Nd can be increased, the absorption coefficient can be increased, whereby the construction of the microchip laser is simplified. The reason why Nd:YVO$_4$ or Nd:GdVO$_4$ is preferable is that it performs laser oscillation with single polarization because the pump efficiency of the solid laser has an anisotropy to the crystal axis.

Since wavelength conversion in the non-linear optical material has polarization dependency, oscillation with single polarization significantly increases the conversion efficiency. Especially in a crystal having a periodic polarization inversion structure, a light axis of birefringence is equal to a light axis of phase matching, and therefore, variation in polarization due to temperature is small, and the conversion efficiency can be enhanced by combining a single polarization laser crystal, thereby realizing stable polarization. Further, Nd:YVO$_4$ and Nd:GdVO$_4$ have extraordinary refractive indexes of 2.165 and 2.15, respectively, which are approximately equal to the refractive index 2.15 of the Mg-doped LiNbO$_3$. Therefore, a difference in refractive index which occurs when optical contact or direct contact is performed is very small, and Fresnel loss is significantly reduced, whereby loss in the resonator is reduced to achieve high efficiency.

Nd:GdVO$_4$ is more preferable to Nd:YVO$_4$ for the solid laser. Since the thermal expansion coefficient of the Nd:GdVO$_4$ crystal is closer to that of the Mg-doped LiNbO$_3$, when the non-linear optical crystal and the solid laser crystal are connected, distortion that might occur at the contact part due to temperature variations in the crystals is small. Therefore, connection processing is facilitated, and stable contact against external temperature variation can be realized.

Further, a ceramic laser using a ceramic instead of a laser crystal is also applicable as a solid laser. Since the ceramic laser is fabricated by sintering a microcrystal, it is easy to mix a different crystal or give a partial distribution to the mixture ratio.

Figure 14A:
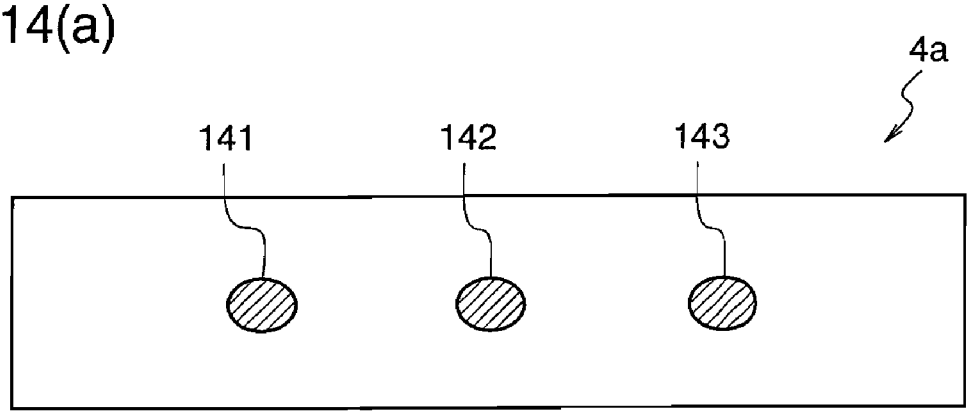
FIG. 14 is a diagram illustrating a construction (14(a)) and another construction (14(b)) of a laser crystal of the laser light source according to the second embodiment of the present invention.
Figure 14B:
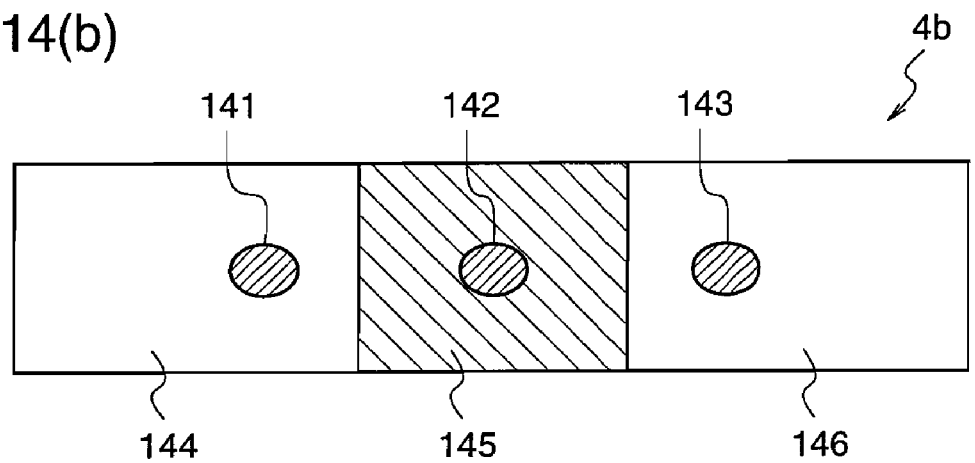

FIG. 14(a) and FIG. 14(b) are diagrams illustrating examples of laser crystals of the laser light source according to the second embodiment of the present invention. FIG. 14(a) shows a cross-sectional structure of an example of a laser crystal. As shown in FIG. 14(a), a laser crystal (solid laser) 4a is pumped at plural pump part 141 to 143, and the pump parts 141, 142, and 143 are constituted by different laser crystal compositions or materials, respectively. For example, the pump parts 141, 142, and 143 are formed of Nd:YVO$_4$, Nd:GdVO$_4$, and Nd:YLF as chief materials, respectively. Thereby, laser oscillations with different wavelengths can be carried out in the pump parts 141, 142, and 143, respectively. When the lasers oscillated in the pump parts are converted by the wavelength conversion elements with the phase matching conditions being adjusted to the respective wavelengths, a laser light source for visible light which emits different oscillation wavelengths simultaneously can be realized. By using this laser light source for a display application, speckle noise is significantly reduced, and a high-definition display is realized. As for the laser mediums of the pump parts, it is possible to vary the oscillation wavelength by varying the material or composition or by mixing the respective laser mediums. Further, not only the oscillation wavelength but also the oscillation spectrum can be expanded. When the oscillation wavelength is expanded and the respective pump parts generate different wavelengths, the speckle noise reduction effect is further enhanced. Since an amorphous material can be easily mixed with a different crystal, distribution of oscillation wavelengths or oscillation characteristics can be easily formed. Further, it is useful for its low cost. Further, when part of the laser crystal other than the pump parts is composed of a YAG material or the like having a high thermal conductivity while only the pump parts are composed of different materials, heat radiation characteristics are increased and thereby stable output characteristics can be obtained even with high output power.

FIG. 14(b) shows a cross-sectional structure of another example of a laser crystal. As shown in FIG. 14(b), the solid laser may be composed of different laser crystals. In FIG. 14(b), the solid laser 4b comprises different laser crystals 144, 145, and 146, and the pump parts 141, 142, and 143 are disposed in the different laser crystals 144, 145, and 146, respectively. Thereby, different laser oscillations can be performed in the respective pump parts, and speckle noise can be suppressed. The oscillation wavelength in each pump part can be varied by varying the material or composition of the laser medium constituting the same or by mixing the crystals of the laser mediums.

As described above, the laser light source 103b according to the second embodiment is provided with the plural semiconductor lasers 2, the solid laser 4, the non-linear material 3 constituting the wavelength conversion element, the reflection coat 5 formed on a facet of the solid laser 4, and the reflection coat 6 formed on a facet of the non-linear material 3, and the solid laser 4 and the wavelength conversion element 3 are disposed between the both reflection coats, the both reflection coats are arranged approximately parallel to each other to constitute a laser resonator, the plural pump parts 8 in the solid laser 4 are pumped by the plural semiconductor lasers 2, and the plural pump parts 8 are separated from each other by 300 μm or more. Therefore, laser oscillation in a stable transverse mode can be performed by alleviating thermal influence between the adjacent pump parts.

FIG. 4(a) is a top view of another example of a laser light source according to the second embodiment, and FIGS. 4(b) and 4(c) are side views thereof.

In the laser light source 103c shown in these figures, a heatsink 1c has step differences, and semiconductor lasers 2 are mounted at different levels. Since the heatsink has the step differences, thermal influence between the semiconductor lasers is reduced, and thereby oscillations in the respective semiconductor lasers are stabilized. Further, since the surface area is increased, the lifetimes of the semiconductor lasers are extended by the cooling effect. Further, by arranging the solid laser stereoscopically, the distance between the light emitting points in the solid laser can be increased with the same size of the solid laser, thereby realizing miniaturization. Further, laser oscillations within the crystal plane where laser oscillation occurs between the adjacent pump parts can be suppressed, whereby laser oscillation loss due to in-plane resonance can be reduced, thereby realizing a highly efficient construction.

Figure 12A:
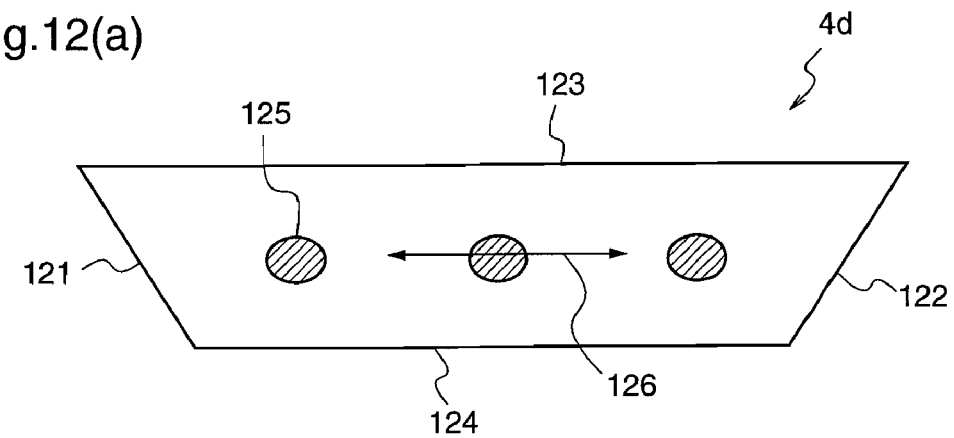
FIG. 12 is a diagram for explaining examples of laser crystals (12(a),12(b),12(c)) in the laser light source according to the second embodiment of the present invention.
Figure 12B:
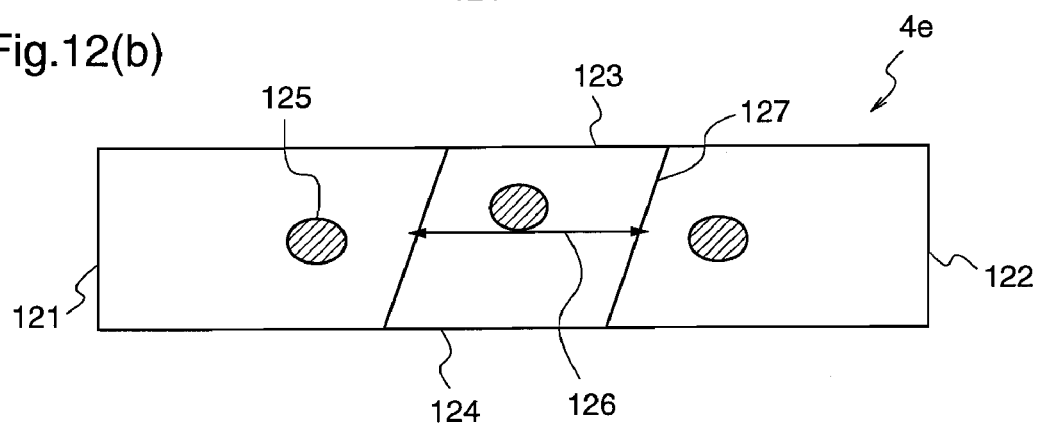
Figure 12C:
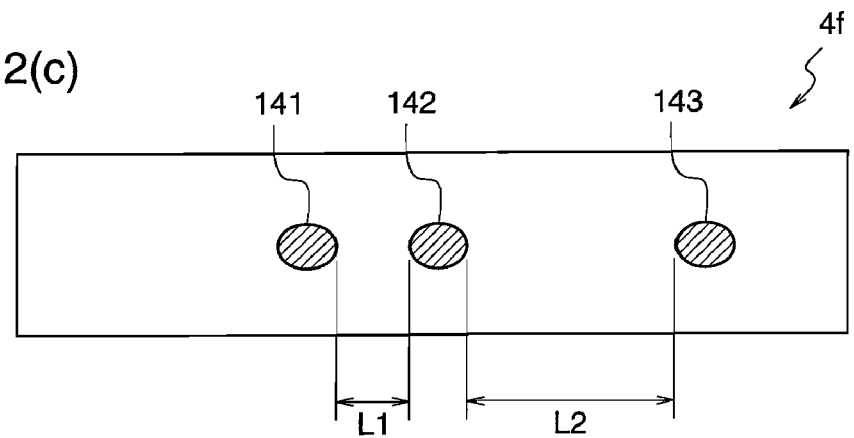

FIG. 12(c) is a diagram illustrating an example of a laser crystal of the laser light source according to the second embodiment. With reference to FIG. 12(c), a description will be given of a construction in which the temperatures of the pump parts are varied from each other in the structure where the solid laser is pumped at the plural pump parts.

In FIG. 12(c), the distance between the adjacent pump parts is set so that the respective pump parts have different temperatures. That is, the distance L1 between the pump part 142 positioned in the center of the solid laser 4f and the pump 141 positioned on one side of the pump part 142 is different from the distance L2 between the pump part 142 positioned in the center of the solid laser 4f and the pump part 143 positioned on the other side of the pump part 142.

As shown in the figure, the pump parts are represented by pump spots, and the temperatures of the pump parts differ from each other when the distances between the respective pump parts differ from each other. The respective pump parts may have different distances from the side surface of the solid laser 4. Alternatively, it is also effective to make the plural pump parts have different pump power densities or different pump spot sizes. This construction can be realized by design of the pump semiconductor lasers and the focusing optical system. When the temperatures of the pump parts are made different from each by the above-described construction, the respective pump parts in the solid laser oscillate with slightly different oscillation wavelengths. Further, the shapes of the oscillation spectrums differ from each other due to the different temperatures. Although the differences in wavelengths are values not larger than 1 nm, when the pump parts oscillate with the different oscillation wavelengths or oscillation spectrums, the wavelength-converted harmonic lights are also generated with different wavelengths or spectrums. By using these lights as a light source for display, interference of plural lights is reduced, and thereby speckle noise caused by the interference is reduced.

FIGS. 12(a) and 12(b) are diagrams illustrating other examples of laser crystals of the laser light source according to the second embodiment, and a construction for suppressing abnormal laser oscillation in the solid laser will be described with reference to these figures.

In FIG. 12(a), 4d denotes a solid laser, 121 and 122 denotes side surfaces of a laser crystal as the solid laser 4d, 123 and 124 denote upper and lower surfaces of the laser crystal as the solid laser 4d, and 125 denotes pump parts of the solid laser.

When the solid laser 4d as a laser medium is pumped by semiconductor lasers, laser oscillation in the resonator length direction is pumped at the pump parts, and thereby laser light resonates between the reflection mirrors constituting the resonator. However, when the intensity of the pump light increases, abnormal laser oscillation (in-plane resonance of the laser crystal) 126 occurs between the both side surfaces 121 and 122 of the laser crystal 4d. Since such laser oscillation results in a loss, the laser oscillation efficiency is significantly reduced. In the present invention, since the solid laser crystal is pumped at plural points, laser oscillation 126 is likely to be induced in the direction perpendicular to the resonator length direction. In order to avoid this, in the present invention, the side surface 121 and the side surface 122 of the laser crystal are designed to be nonparallel to each other. Thereby, abnormal laser oscillation is suppressed and stable oscillation is achieved. Further, it is also effective to make the side surfaces sandy to reduce the reflectivities at the side surfaces.

Further, a solid laser 4e having the construction shown in FIG. 12(b) is also effective. In FIG. 12(b), the pump parts 125 are arranged alternately at different levels by utilizing the construction shown in FIG. 4. Thereby, abnormal laser oscillation 126 due to mutual interaction between the adjacent pump parts is avoided. Further, grooves 127 are formed between the respective pump parts. The grooves are nonparallel to the side surfaces 121 and 122 to enhance the effect. Abnormal laser oscillation within the crystal plane can be avoided by separating the pump parts with the grooves, thereby obtaining stable high efficiency. Further, insertion of such grooves in the solid laser crystal is also effective for reducing a difference in thermal expansion when the non-linear optical crystal and the laser crystal are bonded together. There is a difference of about two times in thermal expansion coefficient between Mg-doped $LiNbO_3$ as the non-linear optical crystal and the laser crystal. Therefore, after these crystals are bonded together, if the temperature rises due to laser pumping or the like, disbonding or distortion might occur due to the difference in thermal expansion. In contrast, when the grooves are inserted in the crystal, the distortion due to the difference in thermal expansion can be absorbed, whereby a construction resistant to temperature variation can be realized. Further, conduction of heat between the pump parts can be avoided.

Embodiment 3

Figure 5A:
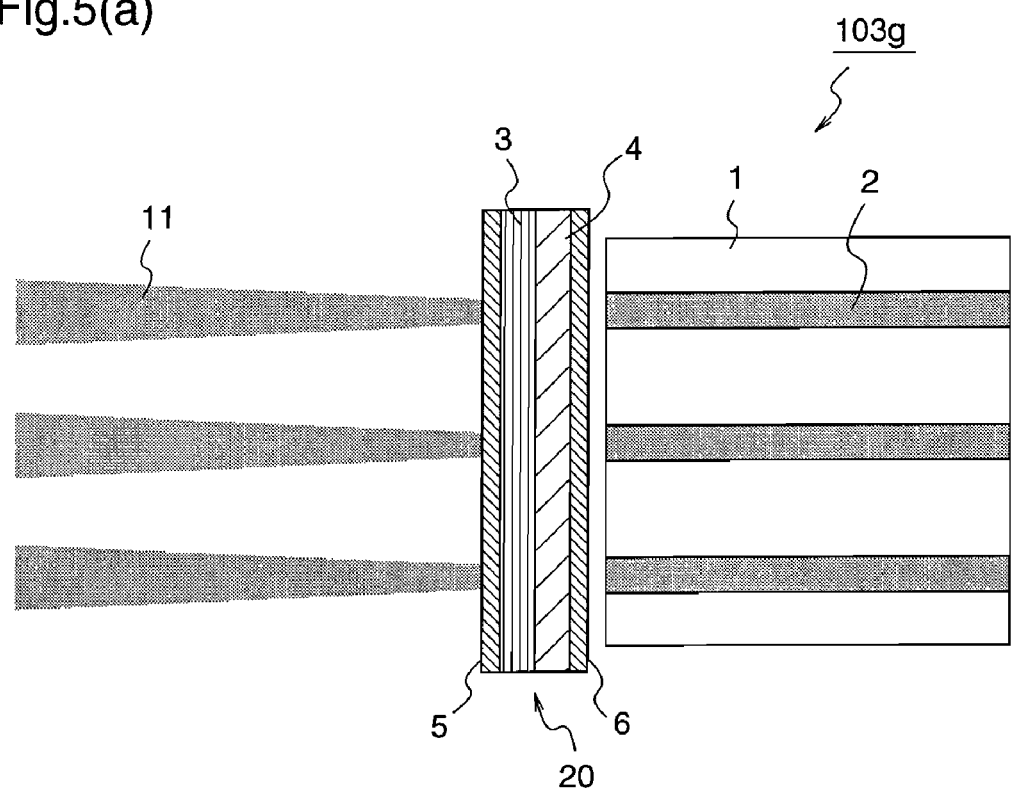
FIG. 5(a) is a top view thereof.
Figure 5B:
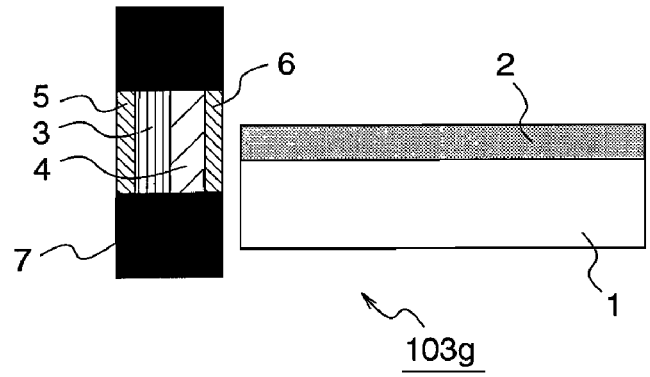
FIG. 5(b) is a side view thereof.

FIG. 5 is a diagram for explaining a laser light source according to a third embodiment of the present invention, wherein FIG. 5(a) is a top view thereof, and FIG. 5(b) is a side view thereof.

In FIG. 5, 103g denotes a laser light source according to the third embodiment. This laser light source 103g is provided with heatsinks 7 for cooling the solid laser 4 and the wavelength conversion element 3 in the laser light source 103b according to the second embodiment shown in FIG. 2. The heatsinks 7 are disposed on and beneath the solid laser 4 and the wavelength conversion element 3 so as to cover them. Other constituents are identical to those of the second embodiment.

Next, the functional effect will be described.

In the laser light source shown in FIG. 5, the heatsinks 7 are disposed on and beneath the solid laser 4 to stabilize the output power. Although the solid laser 4 absorbs the light from each pumping semiconductor laser 2 and converts it into a light of 1.06 μm, the conversion efficiency is about 50%, and half of the pumped light changes to heat. While the laser oscillation in the solid laser is stabilized by the thermal lens effect due to this heat, it is necessary to suppress an influence between the adjacent pumping parts. In this third embodiment, in order to solve this problem, the solid laser is provided with the heatsinks 7. Since the heat generated in the solid laser is sufficiently radiated to the outside by the heatsinks 7, miniaturization of the whole construction can be achieved.

While in this third embodiment the heatsinks 7 are disposed on and beneath the solid laser 4, arrangement of the heatsinks 7 is not restricted thereto.

Figure 6A:
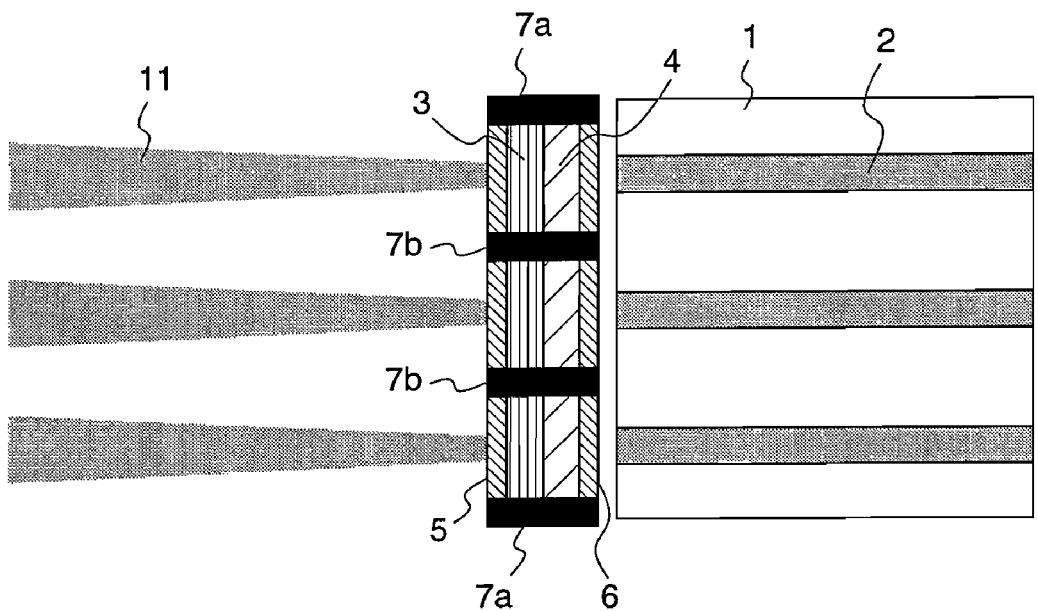
FIG. 6(a) is a top view thereof.
Figure 6B:
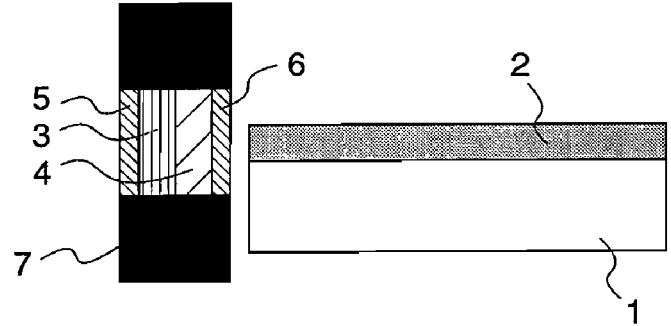
FIG. 6(b) is a side view thereof.

For example, in the laser light source shown in FIG. 5, when heatsinks 7a are disposed on the both side surfaces of the solid laser while heatsinks 7b are disposed between the pumping parts in the solid laser as shown in FIG. 6, higher cooling performance can be realized. Thereby, further increase in the output power can be achieved.

Figure 7A:
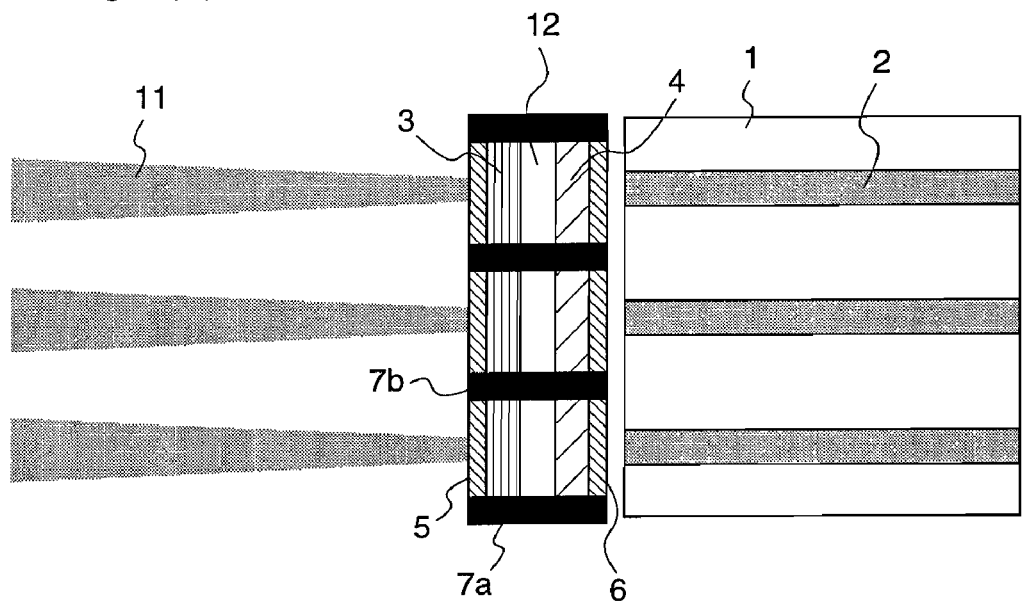
FIG. 7(a) is a top view thereof.
Figure 7B:
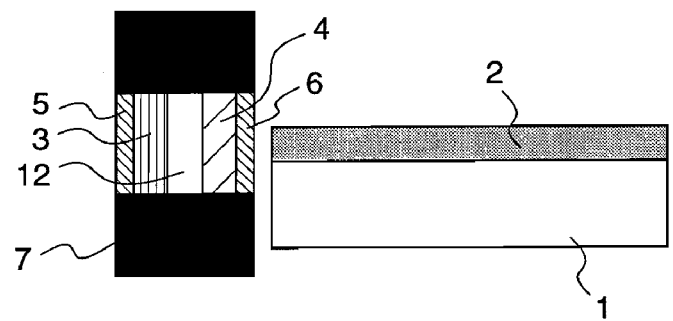
FIG. 7(b) is a side view thereof.

When the output power is further increased as described above, conduction of heat from the solid laser to the non-linear optical crystal becomes a problem. Since the temperature of the solid laser crystal rises by 10° C. to several 10° C., if the temperature is propagated to the non-linear crystal, the characteristics become unstable, resulting in a problem that phase mismatch occurs and output power is reduced. In order to avoid this problem, in the laser light source shown in FIG. 6, it is effective to provide a heat separation layer 12 between the solid laser 4 and the non-linear material 3 as shown in FIG. 7. As the heat separation layer, an air layer having a high adiabatic effect is effective. Further, it is also effective to insert a material that is transparent and has a high thermal conductivity such as YAG to let heat escape from the heatsinks.

Further, the conduction of heat between the semiconductor lasers and the solid laser makes the laser oscillation unstable. Therefore, it is preferable to thermally separate the heatsink on which the semiconductor lasers are disposed from the solid laser. To be specific, it is desired to fix the lasers via a material having a low thermal conductivity such as a ceramic material.

While the laser light source according to this third embodiment is obtained by providing the laser light source according to the second embodiment with the heatsinks 7, the laser light source according to the third embodiment may be obtained by providing the laser light source according to the first embodiment with the heatsinks 7.

Further, it is also effective to use a fiber array instead of the semiconductor lasers as the pump lasers in the third embodiment.

Embodiment 4

Figure 15A:
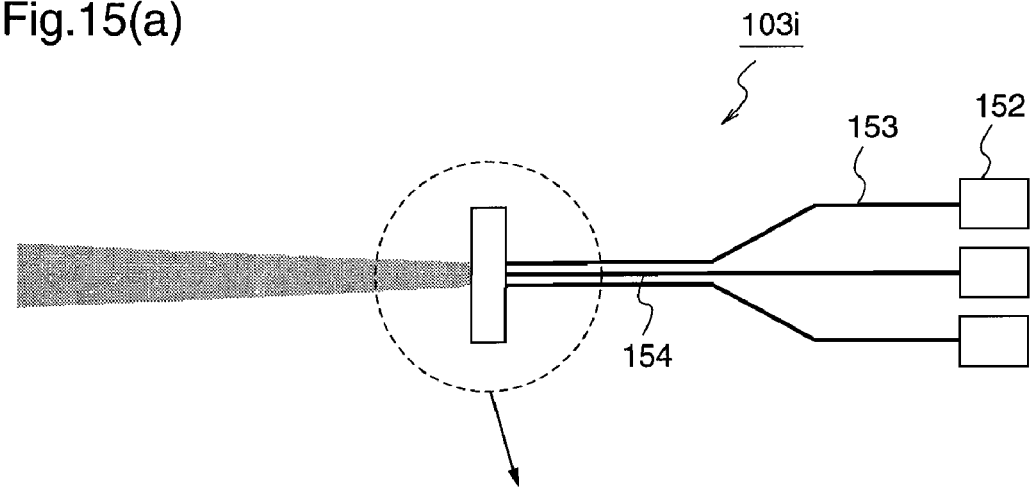
FIG. 15(a) is a top view thereof.
Figure 15B:
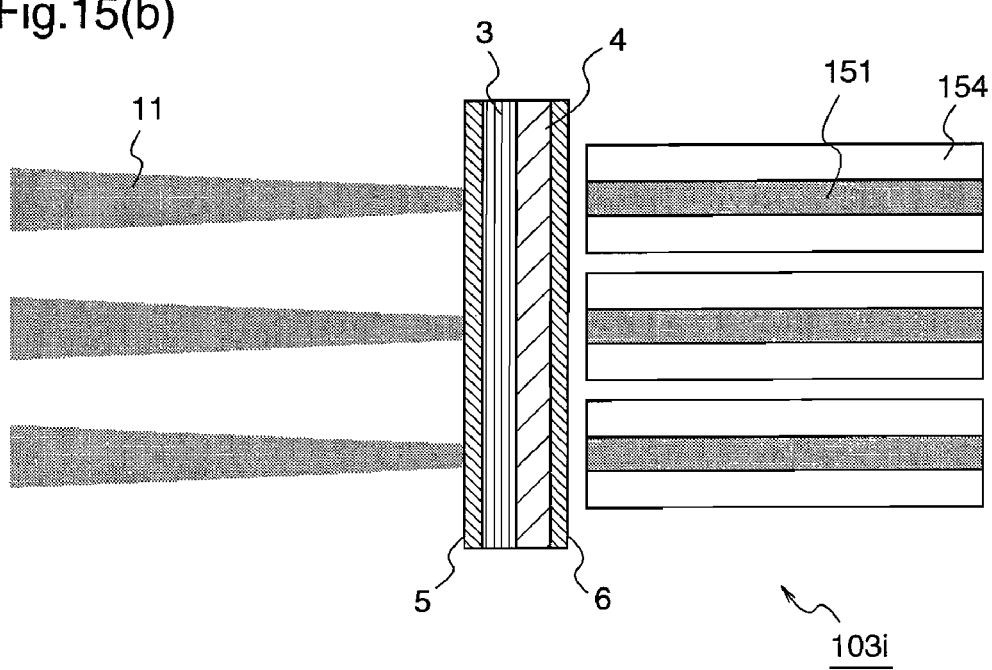
FIG. 15(b) is a side view thereof.

FIG. 15 is a diagram for explaining a laser light source according to a fourth embodiment of the present invention, wherein FIG. 15(a) is a top view thereof, and FIG. 15(b) is a side view thereof.

In the laser light source 103i according to the fourth embodiment, pump lights from semiconductor lasers 152 are introduced into the solid laser 4 via optical fibers 153, while the solid laser 4 is directly pumped by the semiconductor lasers 2 in the laser light source 103a according to the first embodiment shown in FIG. 1. Other constituents are identical to those of the first embodiment.

In this fourth embodiment, a pump light source is constituted by three optical fibers 153 and the three semiconductor lasers 152 generating pump lights, and the lights from the semiconductor lasers 152 are guided by the fibers 153 to the solid laser 4 having the resonator structure. A construction using a fiber array as such pump light source is also effective in realizing stable high-power characteristics.

One ends 154 of the plural fibers 153 are arranged in an array as shown in FIG. 15(b), and the solid laser 4 is disposed close to the ends 154 of the three fibers 153 arranged in an array. Further, the other ends of the respective fibers 153 are positioned separated from each other as shown in FIG. 15(a). The respective semiconductor lasers 152 generating pump lights are connected to the other ends of the respective fibers 153, and are separated from each other so as not to be thermally influenced with each other. Thereby, it is possible to use plural semiconductor lasers of several W without using a cooling unit such as a water cooler or a Peltier.

Further, in this fourth embodiment, the ends 154 of the respective fibers 153 are arranged in an array, separated from each other with an interval between their cores 151 being about 200 μm. Thereby, the pump parts in the solid laser 4 can be designed so as to be located in positions separated from each other. By avoiding influence of heat between the plural pump parts of the semiconductor laser 4, high-power visible lights can be generated. Further, by disposing the plural semiconductor lasers separated from each other, the heat radiation effect is enhanced, and an increase in output power by air cooling can be achieved. Further, since the distance between solid laser and the semiconductor lasers can be increased, the heats of the semiconductor lasers do not adversely affect the solid laser, resulting in an advantage that heat radiation of the solid laser is facilitated. In this construction, stable high-power characteristics can be obtained by securing a distance that can separate the influence of heat between the adjacent pump parts of the solid laser and between the adjacent wavelength conversion parts of the wavelength conversion elements.

When using a fiber, a fiber grating obtained by forming a grating structure on a fiber may be used, whereby a specific wavelength is fed back to the semiconductor lasers to fix the oscillation wavelength of the solid laser. Further, it is desirable to fix the polarization by using a polarization maintaining fiber. As a fiber to be used, a multimode fiber having a core diameter of about 50 to 100 μm is preferable. If the core diameter is large, the number of multimodes of the propagated laser light is increased, and polarization maintenance becomes difficult. Therefore, the core diameter is preferably reduced to 100 μm or less. Accordingly, coupling loss with the fiber can be reduced by setting the stripe width of the pump semiconductor laser to 100 μm or less.

Embodiment 5

FIG. 13 is a diagram for explaining a laser light source according to a fifth embodiment of the present invention, wherein FIG. 13(*a*) is a top view thereof, and FIG. 13(*b*) is a side view thereof.

The laser light source 103*j* according to the fifth embodiment is obtained by disposing a narrow-band wavelength filter 133 on the light emitting side of the semiconductor lasers 2 to lock the oscillation wavelengths of the semiconductor lasers 2 in the laser light source 103*g* according to the third embodiment shown in FIG. 5.

In this fifth embodiment, a microlens array 131 is disposed on an end surface of the narrow-band wavelength filter 133 while a microlens array 132 is disposed on the other end surface thereof.

In the laser light source 103*j* thus constituted, the outputs from the pump semiconductor lasers 2 are collimated by the microlens array 131, and the collimated lights which have passed through the wavelength filter 133 are focused onto the facet of the solid laser 4 by the microlens array 132. The wavelength filter 133 has narrow band characteristics, and the oscillation wavelengths of the semiconductor lasers 2 can be fixed to the transmission wavelength of the wavelength filter 133 by that the lights which have passed through the wavelength filter 133 are reflected at the solid laser facet and returned to the semiconductor lasers 2. Thereby, even when the external temperature varies, laser oscillation is carried out without the oscillation wavelengths of the semiconductor lasers being wobbled, resulting in a stable output power from the solid laser.

Embodiment 6

Figure 8A:
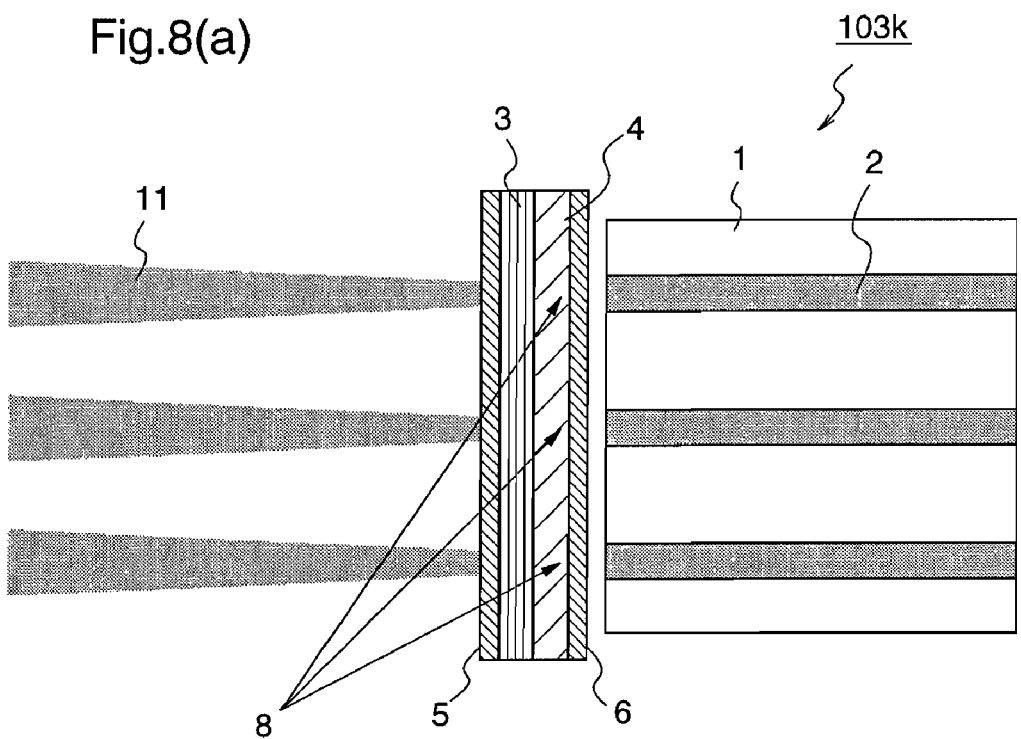
FIG. 8(a) is a top view thereof.
Figure 8B:
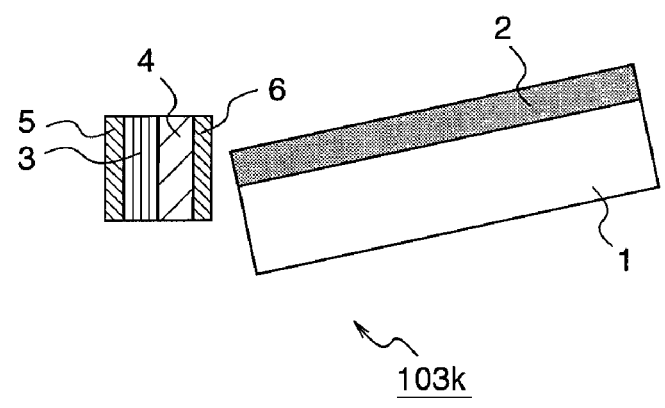
FIG. 8(b) is a side view thereof.

FIG. 8 is a diagram illustrating a laser light source according to a sixth embodiment of the present invention, wherein FIG. 8(*a*) is a top view thereof, and FIG. 8(*b*) is a side view thereof.

In FIG. 8, reference numeral 103*k* denotes a laser light source according to the sixth embodiment. This laser light source 103*k* is obtained by inclining the heatsink 1 on which the semiconductor lasers 2 are mounted so that the optical axes of the semiconductor lasers 2 are oblique with respect to the light incident facet of the solid laser 4, in the laser light source 103*b* according to the second embodiment shown in FIG. 2. Other constituents are identical to those of the second embodiment.

The laser light source 103*k* according to the sixth embodiment is called a microchip laser, and this microchip laser is constituted such that the facet of the solid laser is directly pumped by the semiconductor lasers, which is effective for miniaturization and cost reduction. The distance between the facet of the solid laser 4 and the semiconductor lasers 2 is about 50 to 100 μm, and the pumping efficiency becomes maximum in a place where the transverse mode of laser oscillation that is pumped in the solid laser is close to the intensity distribution of the pump lights from the semiconductor lasers. An influence of return light from the laser is a major factor for deterioration of the semiconductor lasers. The light reflected at the facet of the solid laser 4 returns to the active layers of the semiconductor lasers. When there is such reflected and returned light, the outputs of the semiconductor lasers become unstable, and the lifetimes thereof are significantly reduced. On the other hand, when the active layers of the semiconductor lasers are slightly inclined with respect to the solid laser facet, the return light is significantly reduced. Thereby, stable output power and long lifetime are achieved. Further, since the beam spots on the solid laser facet are reduced in size, the pumping efficiency is enhanced.

The angle at which the light axes of the semiconductor lasers 2 are inclined with respect to the facet of the solid laser 4 is preferably 0.5° or larger, and more preferably, it should be 3° or larger.

While in this sixth embodiment the light axes of the semiconductor lasers 2 are inclined with respect to the facet of the solid laser 4 in the laser light source according to the second embodiment, the laser light source according to the sixth embodiment may be obtained by inclining the light axes of the semiconductor lasers 2 with respect to the facet of the solid laser 4 in any of the above-mentioned embodiments other than the second embodiment.

Embodiment 7

Figure 18A:
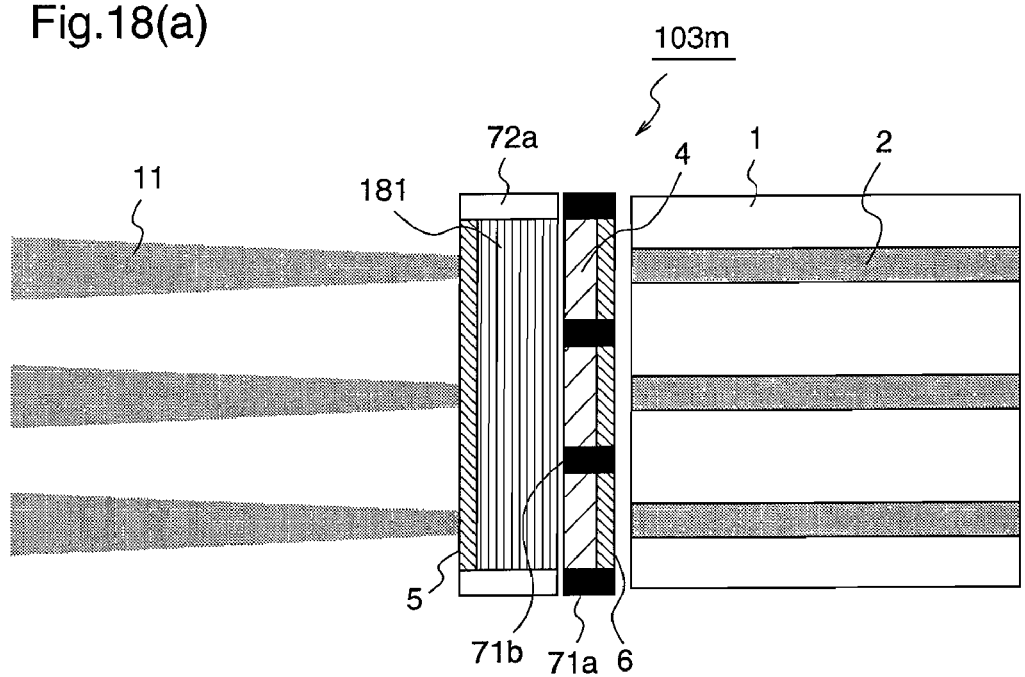
FIG. 18(a) is a top view thereof.
Figure 18B:
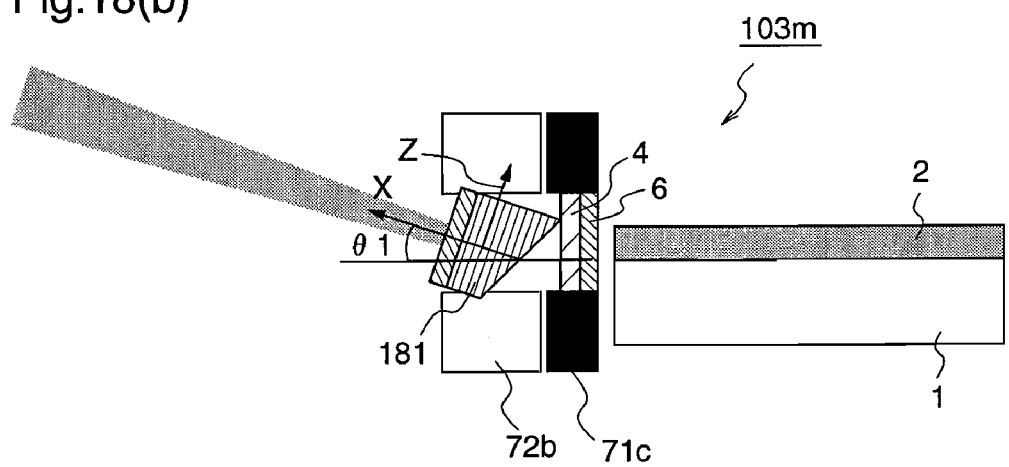
FIG. 18(b) is a side view thereof.

FIG. 18 is a diagram illustrating a laser light source according to a seventh embodiment of the present invention, wherein FIG. 18(*a*) is a top plan view thereof, and FIG. 18(*b*) is a side view thereof.

In FIG. 18, reference numeral 103*m* is a laser light source according to the seventh embodiment. This laser light source 103*m* includes a solid laser 4 which performs laser oscillation, a wavelength conversion element 181 disposed close to the solid laser 4, and plural semiconductor lasers 2 for pumping the solid laser 4, which are fixed onto a heatsink 1.

The solid laser 4 has a reflection coat 6 formed at its facet to which pump lights are incident, and heatsinks 71*a* are attached to its both side surfaces parallel to the optical axis of the pumped lights. In the solid laser 4, plural pump parts to be pumped by the pump lights from the plural semiconductor lasers 2 are arranged on a straight line in the direction parallel to the arrangement direction of the semiconductor lasers 2, and the adjacent pump parts are thermally separated by a heatsink 71*b*.

Further, the wavelength conversion element 181 comprises a non-linear optical crystal, and a reflection coat 5 is formed on a facet at the laser light emitting side, while a facet on the opposite side is processed so as to be inclined with respect to the light emitting facet. This wavelength conversion element 181 is inclined so that an X axis of the non-linear optical crystal as its optical axis forms a predetermined angle θ1 with respect to the optical axes of the pump lights from the semiconductor lasers 2, and heatsinks 72a are attached to the both side surfaces of the wavelength conversion element 181 while heatsinks 72b are attached to the upper and lower surfaces thereof.

A laser resonator is constituted by the both reflection coats 5 and 6, and the solid laser 4 and the wavelength conversion element 181 disposed between these reflection coats.

While in FIG. 18 the heatsink on the solid laser 4 side and the heatsink on the wavelength conversion element 181 side are separated from each other, these heatsinks may be united as one body.

Next, the functional effect will be described.

Reflection of the fundamental wave can be reduced by polishing one facet of the non-linear optical crystal constituting the wavelength conversion element 181 so that the facet forms a Brewster angle with respect to the optical axis of the incident light, and simultaneously, polarization separation characteristics can be enhanced, thereby enhancing the stability of the output power.

The reflectivity of the polarized component that is parallel to the paper surface becomes approximately zero by making the optical axis of the non-linear optical crystal 181 form a Brewster angle with respect to the optical axis of the incident light, and the resonator loss is reduced, thereby suppressing oscillations of other polarized lights. In this seventh embodiment, PPMgLN having a periodic polarization inversion structure is adopted as the non-linear material 181. When the angle θ1 formed between the X axis of the crystal and the optical axis is set to about 25° with the acute angle of the crystal being about 65°, the Brewster condition can be satisfied with respect to the fundamental wave having a wavelength of 1064 nm. At this time, green light is emitted in the direction of about 25° as shown in the figure. When the angle formed between the optical axis of the non-linear optical crystal 181 and the optical axis of the incident light is set to the Brewster angle, the non-reflection coat at the facet of the non-linear optical crystal is dispensed with, whereby cost reduction can be achieved. Further, when the conventional KTP is used as the non-linear optical crystal 181, a crystal length of several mm is required because its non-linear optical constant is low, and further, the resonator length is increased if the non-linear optical crystal 181 is diagonally arranged as shown in FIG. 18. Thereby, the stability of the resonator is degraded, and the conversion efficiency is reduced. In contrast to the KTP, the PPMgLN has a large non-linear constant, and thereby a high conversion efficiency can be obtained even if its crystal length is 1 mm or low. Therefore, even when the non-linear optical crystal 181 is diagonally arranged as shown in FIG. 18, it is possible to set the resonator length to 2 mm or less. Thereby, stabilization of the resonator can be realized.

Further, a construction in which the opposed facets of the solid laser crystal and the PPMgLN crystal are inclined so as to form a Brewster angle with each other is also effective.

Embodiment 8

FIG. 19 is a diagram illustrating a laser light source according to an eighth embodiment of the present invention, wherein FIG. 19(*a*) is a top plan view thereof, and FIG. 19(*b*) is a side view thereof.

In FIG. 19, reference numeral 103n is a laser light source according to the eighth embodiment. This laser light source 103n includes a solid laser 4 which performs laser oscillation, a wavelength conversion element 182 disposed close to the solid laser 4, and plural semiconductor lasers 2 for pumping the solid laser 4, which are fixed onto a heatsink 1.

In this eighth embodiment, a narrow band wavelength filter 133 is disposed between the solid laser 4 and the semiconductor lasers 2 to lock the oscillation wavelengths of the semiconductor laser 2. A microlens array 131 is disposed on an end surface of the narrow band wavelength filter 133 while a microlens array 132 is disposed on the other surface thereof.

Further, the solid laser 4 has a reflection coat 6 formed at its facet to which pump lights are incident. In this solid laser 4, plural pump parts to be pumped by the pump lights from the plural semiconductor lasers 2 are arranged on a straight line in the direction parallel to the arrangement direction of the semiconductor lasers 2 on the heatsink 1, and these pump parts are separated from each other by 300 µm or more as in the second embodiment. Further, the wavelength conversion element 182 is identical to the wavelength conversion element 181 according to the seventh embodiment. Further, heatsinks 73 are attached to the upper surfaces and the lower surfaces of the solid laser 4 and the wavelength conversion element 182 so as to cover them.

In this eighth embodiment, since the plural pump parts in the solid laser 4 to be pumped by the plural semiconductor lasers 2 are separated from each other by 300 µm or more, thermal influence between the adjacent pump parts is alleviated to perform laser oscillation in a stable transverse mode.

Further, in this eighth embodiment, the stability of the output can be enhanced by reducing the reflection of the fundamental wave and enhancing the polarization separation characteristics as in the seventh embodiment. Furthermore, since the wavelength filter 133 having the narrow band characteristics is disposed on the light emitting side of the pump semiconductor lasers 2 to lock the oscillation wavelengths of the semiconductor lasers 2, the semiconductor lasers perform laser oscillations without wobbling the oscillation wavelengths thereof even when the external temperature varies, whereby stable solid laser output can be obtained.

Embodiment 9

FIG. 20 is a diagram illustrating a laser light source according to a ninth embodiment of the present invention, wherein FIG. 20(*a*) is a top plan view thereof, and FIG. 20(*b*) is a side view thereof.

In FIG. 20, reference numeral 103p is a laser light source according to the ninth embodiment. This laser light source 103p includes a solid laser 202 which performs laser oscillation, a wavelength conversion element 201 disposed close to the solid laser 202, and plural semiconductor lasers 2 for pumping the solid laser 202, which are fixed onto a heatsink 1.

The solid laser 202 has a reflection coat 6 formed at its facet to which pump lights are incident, and a light emitting facet on the opposite side is processed so as to incline with respect to the light incident facet. In this solid laser 202, plural pump parts to be pumped by the pump lights from the plural semiconductor lasers 2 are arranged on a straight line in the direction parallel to the arrangement direction of the semiconductor lasers 2 on the heatsink 1, and these pump parts are separated from each other by 300 µm or more as in the second embodiment. Further, the wavelength conversion element 201 comprises a non-linear optical crystal, and a reflection coat 5 is formed on its facet at the laser light emitting side, and its light incident side facet on the opposite side is processed so as to be parallel with the inclined facet of the solid semiconductor laser 202.

Further, heatsinks 74 are attached to the upper surfaces and the lower surfaces of the solid laser 202 and the wavelength conversion element 182 so as to cover them.

Next, the functional effect will be described.

In this ninth embodiment, the plural pump parts in the solid laser 202 to be pumped by the plural semiconductor lasers 2 are separated from each other by 300 μm or more, and thereby thermal influence between the adjacent pump parts is reduced to perform laser oscillation in a stable transverse mode.

Further, Nd:YVO$_4$ is used as an optical crystal constituting the solid laser 202, and PPMgLN is used as a non-linear optical material constituting the wavelength conversion element 201. The Nd:YVO$_4$ and the PPMgLN have approximately equal refractive indexes with respect to the fundamental wave of 1064 nm. Therefore, as shown in FIG. 20, the Brewster angels of the solid laser 202 and the wavelength conversion element 201 can be made approximately equal to each other. Thereby, the construction of the resonator part including the solid laser 202 and the wavelength conversion element 201 is simplified, and position adjustment of the resonator is facilitated. Further, since both the solid laser crystal and the non-linear material require no AR (Anti Reflection) coats on the opposed facets, cost reduction and high reliability are achieved. Furthermore, since the loss due to the reflection coats can be reduced to a negligible level, the laser oscillation efficiency can be enhanced. Furthermore, in the construction of the resonator, Mg-doped LiTaO$_3$ (PPMgLT) having a periodic polarization inversion structure may be utilized besides the PPMgLN. Since the absorption loss of the PPMgLT is small, high-power characteristics can be realized.

Furthermore, in this ninth embodiment, since a wavelength filter 133 having narrow band characteristics is disposed on the light emitting side of the pump semiconductor lasers 2 to fix the oscillation wavelengths of the semiconductor lasers 2 as in the laser light source 103*j* according to the fifth embodiment shown in FIG. 13, the oscillation wavelengths of the semiconductor lasers are not wobbled even when the external temperature varies, thereby obtaining stable solid laser output.

While in this ninth embodiment the narrow band filter is used for mixing the wavelengths of the semiconductor lasers, a volume grating can be used instead of the filter. Since the volume grating utilizing Bragg reflection of a grating has less transmission loss relative to the narrow band filter, a light source of a higher efficiency can be realized.

Embodiment 10

Figure 9A:
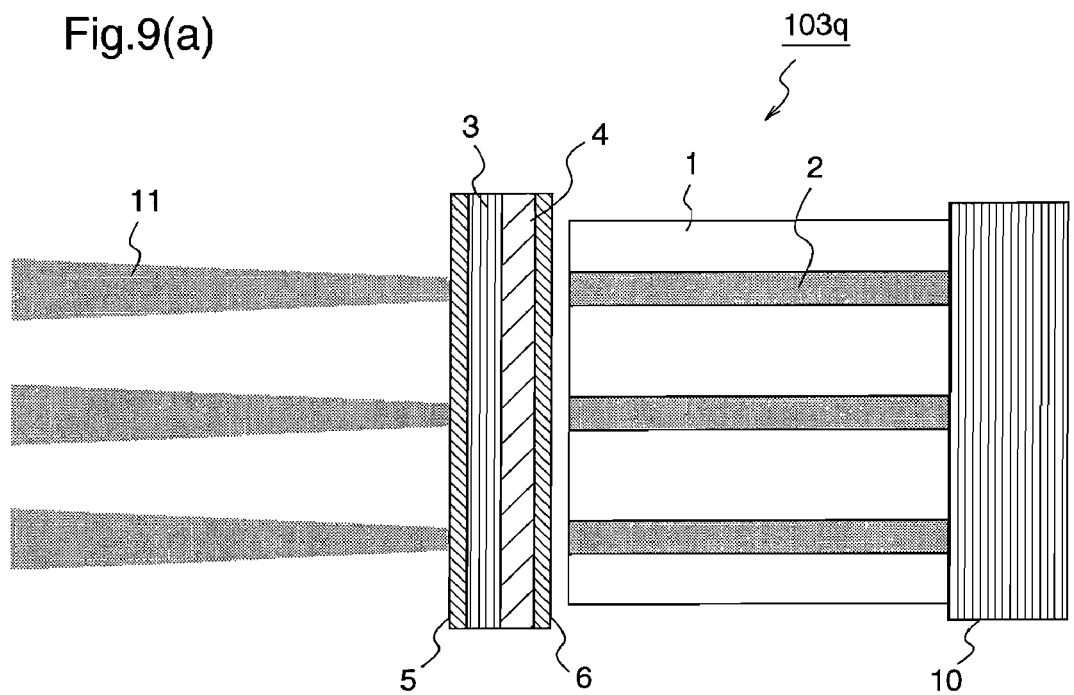
FIG. 9(a) is a top view thereof.
Figure 9B:
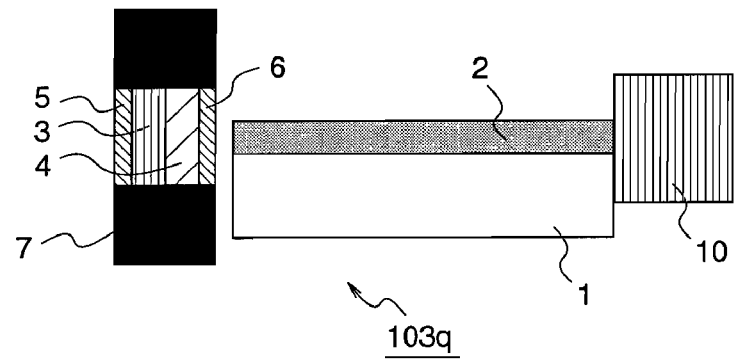
FIG. 9(b) is a side view thereof.

FIG. 9 is a diagram for explaining a laser light source according to a tenth embodiment of the present invention, wherein FIG. 9(*a*) is a top view thereof, and FIG. 9(*b*) is a side view thereof.

The laser light source 103*q* according to the tenth embodiment is obtained by a volume grating 10 is disposed on the rear surfaces of the semiconductor lasers 2 to lock the oscillation wavelengths of the semiconductor lasers 2 in the laser light source 103*g* according to the third embodiment shown in FIG. 5. Other constituents are identical to those of the third embodiment.

Next, the functional effect will be described.

The solid laser to be pumped by the semiconductor lasers has a problem that the absorption spectrum of the solid laser is narrow, and the output power is reduced when the oscillation wavelengths of the semiconductor lasers deviate from the absorption spectrum of the solid laser due to external temperature variation. The construction shown in FIG. 9 is proposed as a method for solving this problem. That is, the volume grating 10 is disposed on the rear surfaces of the semiconductor lasers described for the third embodiment. Since the semiconductor lasers are fixed by a Bragg wavelength from the volume grating 10, the wavelengths thereof do not vary even when the external temperature varies. Therefore, stable pumping of the solid laser can be performed, and variation in the output power due to the external temperature variation can be significantly reduced. Further, in this construction, the construction wherein the semiconductor lasers are inclined with respect to the solid laser facet shown in FIG. 8 is more effective. When the oscillation wavelengths of the semiconductor lasers are fixed by the diffracted light from the grating, if return light from another reflection plate is incident on the semiconductor lasers, stable fixing of wavelengths becomes difficult. Since the return light from the solid laser facet into the semiconductor lasers can be reduced by inclining the semiconductor lasers with respect to the facet of the solid laser, stable fixing of wavelengths can be realized.

FIG. 21 is a diagram for explaining another example of a laser light source according to the tenth embodiment of the present invention, wherein FIG. 21(*a*) shows a top view thereof, and FIG. 21(*b*) is a side view thereof.

In FIG. 21, reference numeral 103*r* denotes a laser light source. This laser light source 103*r* is obtained by providing a volume grating 211 instead of the narrow band wavelength filter 133, and disposing heatsinks 213 in positions on the surface of the reflection coat 6 where the pump lights from the semiconductor lasers 2 are not blocked, in the laser light source 103*p* of the ninth embodiment shown in FIG. 20. Further, in the laser light source 103*r*, a heat separation layer 212 is disposed between the solid laser 202 and the wavelength conversion element 201, and heatsinks 75 are disposed on the side surfaces of the solid laser 202 and the wavelength conversion element 201 so as to cover them.

The semiconductor lasers 2 are multistripe semiconductor lasers each having plural stripes, and they are fixed onto the heatsink 1. The volume grating 211 sandwiched by the microlens arrays 131 and 132 returns a laser light of a specific wavelength among the laser lights generated from the semiconductor lasers 2 back to the semiconductor lasers 2, and the oscillation wavelengths of the semiconductor lasers 2 can be fixed to the reflection wavelength of the volume grating 211. Thereby, even when the external temperature varies, the oscillation wavelengths of the semiconductor lasers can be fixed to about 808 nm that is the absorption wavelength of the solid laser, whereby stable oscillation of the solid laser is realized. Further, by using the microlens arrays, miniaturization of the optical system can be achieved.

The solid laser 202 and the non-linear material as the wavelength conversion element 201 are fixed with the heat separation layer 212 between them. An air layer or YAG crystal or diamond having a high thermal conductivity can be adopted as the heat separation layer 212. The heat separation layer 212 prevents the heat generation in the solid laser 212 from propagating to the non-linear material 201. In this example, the heat separation layer 212 is disposed diagonally to the optical axis of the solid laser 202 to prevent generation of unnecessary polarization components in the solid laser 202. The heatsinks are disposed on the side surfaces of the solid laser 202 and on the surface of the solid laser between the pump parts to be pumped by the lights from the microlens. Thereby, propagation of heat between the pump spots in the solid laser 202 is significantly reduced, and thermal influences in the plural pump parts are suppressed, resulting in plural laser oscillations of high output power.

The advantages of using YAG crystal or diamond for the heat separation layer 212 reside in that, in addition to heat separation, the heats generated in the solid laser 202 and the non-linear material 201 are dispersed to a wider region to suppress temperature rise and thereby high output power is realized, and in that the distance between the solid laser 202 and the non-linear material 201 can be accurately controlled by the thickness of the heat separation layer 212. The surface accuracy of the solid laser resonator is important for enhancing the efficiency of laser oscillation. By using a base material having a high flatness for the heat separation layer, the fabrication precision is enhanced, and thereby the resonator can be fabricated with higher precision. Thereby, the fabrication yield is increased.

FIG. 22 is a diagram for explaining another example of a laser light source according to the tenth embodiment of the present invention, wherein FIG. 22(a) is a top view thereof, and FIG. 22(b) is a side view thereof.

The laser light source 103s shown in FIG. 22 is obtained by providing a transparent heatsink 221 on the light incident facet of the solid laser in the laser light source 103r shown in FIG. 21. Further, in this laser light source 103s, the construction of diagonally processing the facets of the crystals constituting the solid laser 4 and the wavelength conversion element 3 is not adopted.

In the laser light source 103s, a diamond thin film is preferable as the transparent heatsink. Since the diamond thin film has an excellent thermal conductivity, the temperature rise of the solid laser can be suppressed to realize high output power. Further, a heatsink 213 is disposed between the adjacent pump parts, whereby the heat diffusion effect is enhanced to suppress temperature rise. A heat separation layer 212 is disposed between the solid laser 4 and the non-linear material 3 to prevent the heat in the solid laser 4 from propagating to the non-linear material 3. In this example, since the construction of arranging the heat separation layer diagonally to the optical axis of the pump light is not adopted, the polarization separation is degraded as compared with that shown in FIG. 21. However, since the construction is simple, fabrication is facilitated. Further, an increase in output power can be realized by performing wavelength conversion at the plural pump parts with the transparent heatsink 221 and the heatsink 213 being combined.

Embodiment 11

Figure 10A:
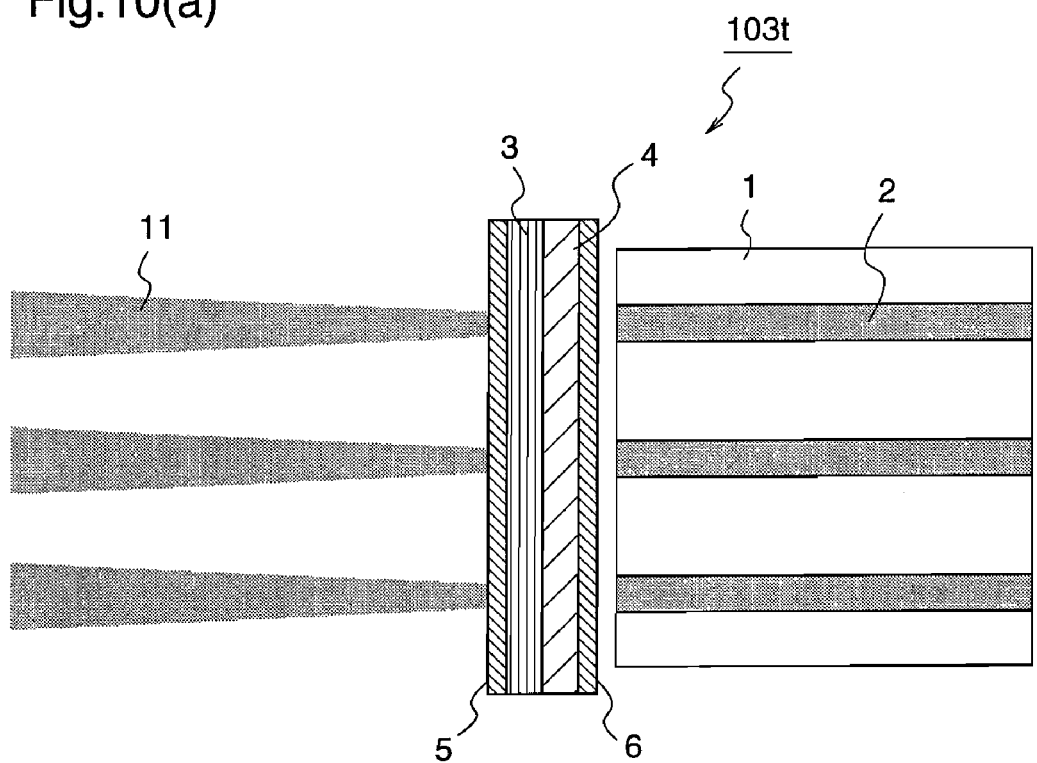
FIG. 10(a) is a top view thereof.
Figure 10B:
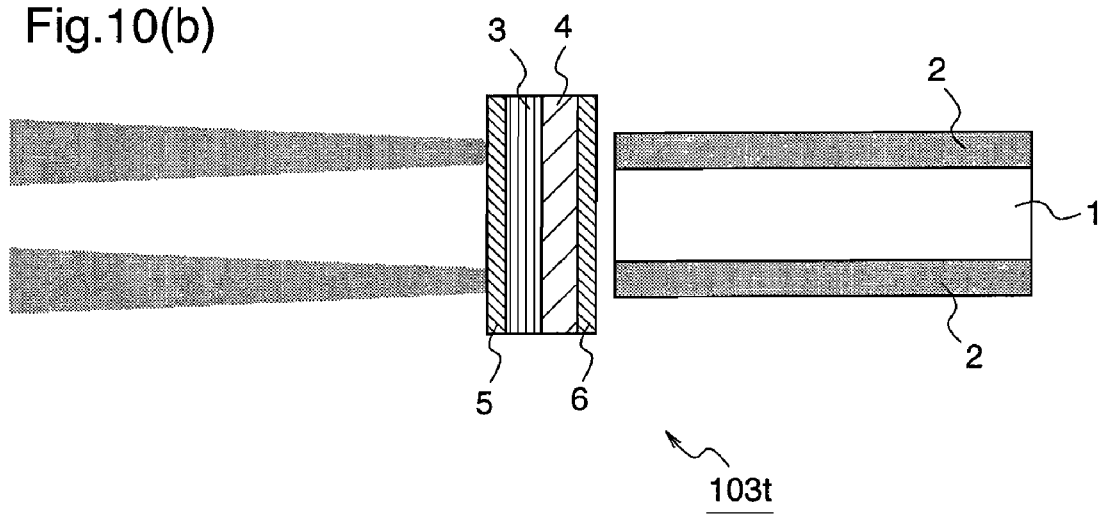
FIG. 10(b) is a side view thereof.

FIG. 10 is a diagram for explaining a laser light source according to an eleventh embodiment of the present invention, wherein FIG. 10(a) is a top view thereof, and FIG. 10(b) is a side view thereof.

In FIG. 10, reference numeral 103t denotes a laser light source according to the eleventh embodiment. The laser light source 103t is obtained by disposing plural semiconductor lasers 2 also on the rear surface side of the heatsink 1 in the laser device 103b of the second embodiment shown in FIG. 2. The plural semiconductor lasers 2 on the rear surface of the heat sink 1 are arranged such that the pump parts in the solid laser 4 to be pumped by these semiconductor lasers are separated from each other by 300 μm or more, and these semiconductor lasers are separated by 300 μm or more from all the pump parts in the solid laser 4 to be pumped by the plural semiconductor lasers 2 disposed on the surface of the heatsink 1.

In the laser light source 103t thus constituted, since the semiconductor lasers 2 are mounted on and beneath the heatsink 1, the mounting density of the semiconductor lasers is increased with less volume, thereby realizing miniaturization of a highly efficient laser light source.

FIG. 11 is a diagram for explaining another example of a laser light source according to the eleventh embodiment of the present invention, wherein FIG. 11(a) is a top view thereof, and FIG. 11(b) is a side view thereof.

In FIG. 11, reference numeral 103u denotes a laser light source. In the laser light source 103u, the thickness of the heatsink in the laser light source 103t of the eleventh embodiment shown in FIG. 10 is decreased as getting closer to the solid laser. In the laser light source 103u, the heatsink 1u is constituted such that its front surface and rear surface are inclined, whereby the pump lights emitted from the semiconductor lasers 111 mounted on the front surface of this heatsink and the pump lights emitted from the semiconductor lasers 112 mounted on the rear surface can be concentrated to a pump part 113 in the solid laser 4. Thereby, the power density in the pump part 113 can be increased, and high power laser oscillation can be achieved. A material having a high thermal conductivity is required for the heatsink, and SiC, diamond, Cu alloy, or the like is preferable.

Whine in the laser light sources of the respective embodiments described above three or six pump parts are pumped in the solid laser, the number of the pump parts is not restricted thereto. Further, the interval between the respective pump parts is not necessarily constant.

Embodiment 12

Figure 16A:
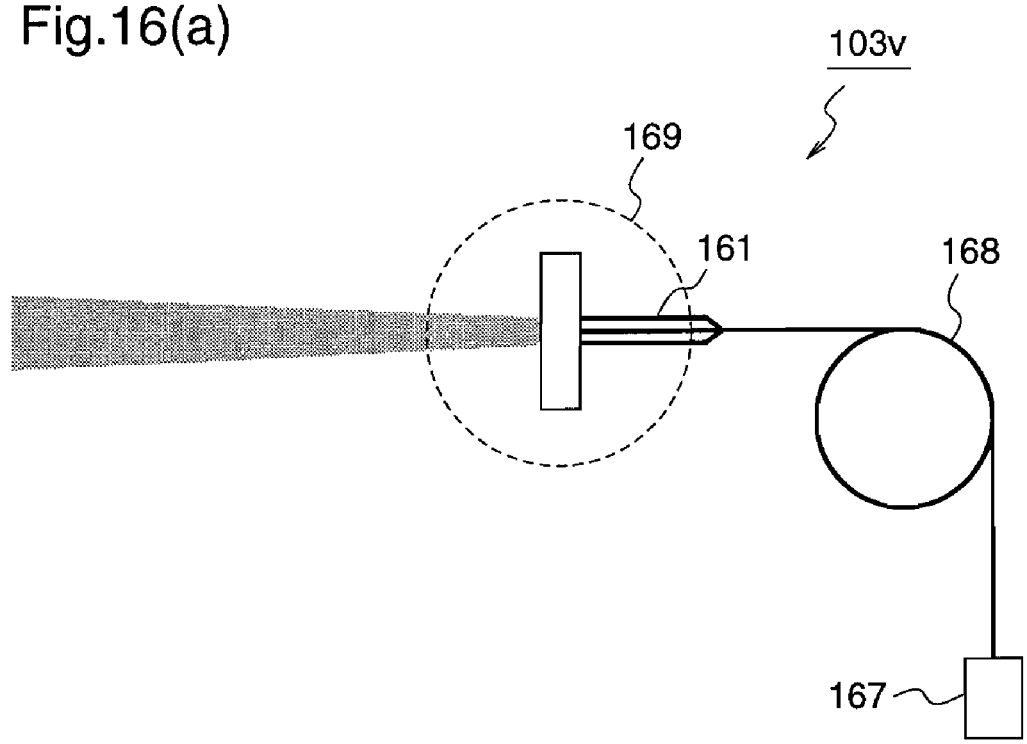
FIG. 16(a) is an overall view thereof.
Figure 16B:
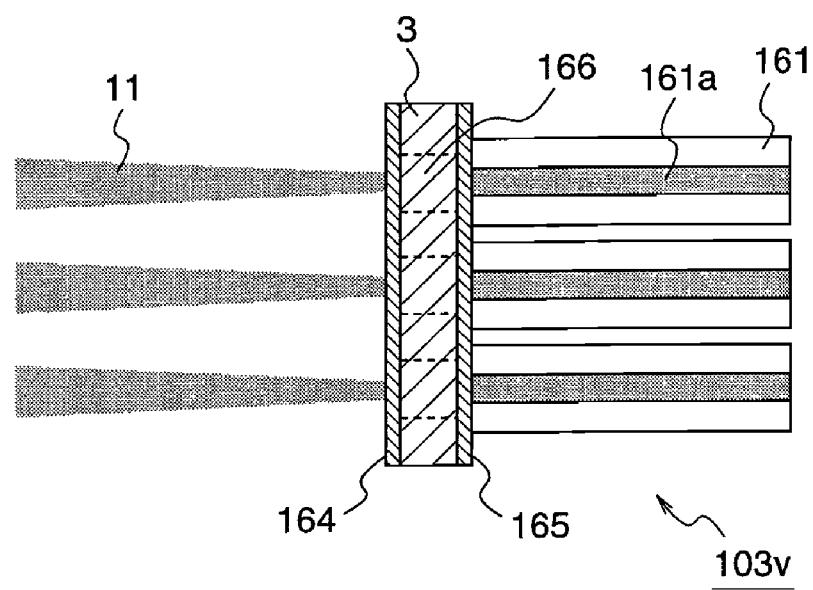
FIG. 16(b) is a partially expanded view thereof.
Figure 17:
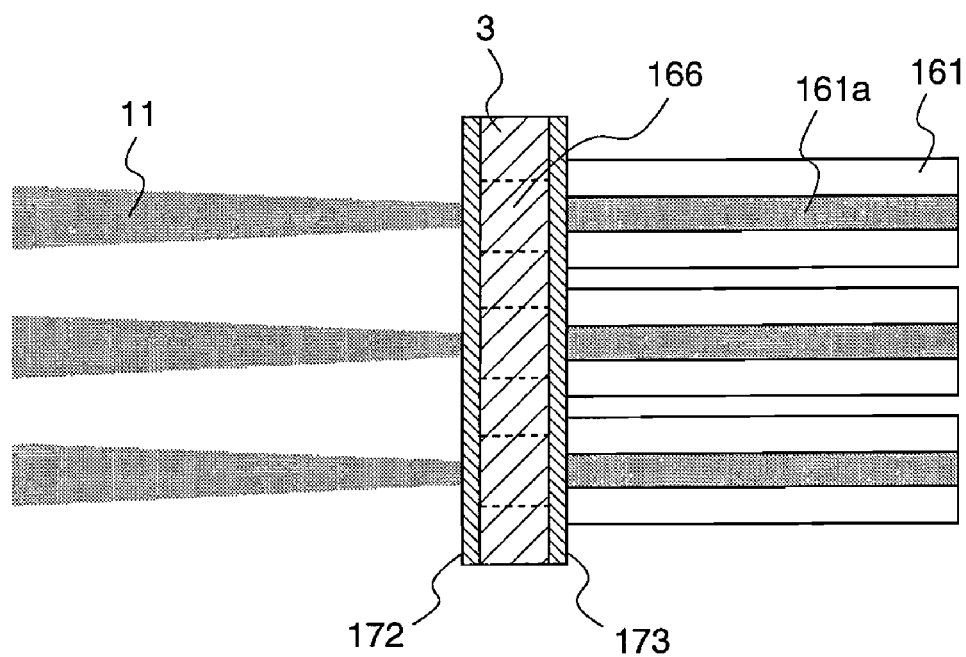
FIG. 17 is a partially expanded view for explaining another example of a laser light source according to the twelfth embodiment of the present invention.

FIG. 16 is a diagram for explaining a laser light source according to a twelfth embodiment of the present invention, wherein FIG. 16(a) is an overall view thereof, and FIG. 16(b) is a partial expanded view thereof. FIG. 17 is a partial expanded view for explaining another example of a laser light source according to the twelfth embodiment of the present invention.

The laser light source 103v of this twelfth embodiment includes a fiber laser 168 for emitting laser light, and a wavelength conversion element 3 for performing wavelength conversion of the laser light emitted from the fiber laser 168.

The wavelength conversion element 3 comprises a non-linear optical crystal, and a reflection coat 165 that transmits infrared light and reflects visible light is formed on a light incident surface of the wavelength conversion element 3, while a reflection coat 164 that transmits visible light and reflects infrared light is formed on a light emitting surface thereof.

Further, the fiber laser 168 comprises a pump light source 167 and a Yb-doped fiber, and an end thereof is connected to the pump light source 167 while the other end is close to a light incident surface of the non-linear optical crystal 3 and is separated into three fiber parts 161. Accordingly, in this laser light source, the wavelength conversion element 3 has three conversion parts.

In the laser light source 103v of this twelfth embodiment, as shown in FIG. 16, the light generated in the fiber laser 168 comprising the pump light source 167 and the Yb-doped fiber is separated by the array structure of the fiber 161, and introduced into the plural parts of the non-linear optical material 3. Then, the lights emitted from the plural fiber parts 161 are converted in the wavelength conversion parts 166 of the non-linear optical material 3, thereby generating plural beams of visible laser lights 11. Since a phenomenon of unstable output power due to heat occurs in the wavelength conversion parts in the non-linear optical material 3 as described for the first embodiment, when each conversion part generates a high power exceeding 1 W, it is necessary to separate the respective conversion parts from each other by 100 µm or more to reduce the output power in each conversion part as well as to suppress thermal influence between the respective conversion parts.

In this twelfth embodiment, single mode fibers each having a core diameter of 8 µm and a clad diameter of 150 µm which are arranged in an array are used as the plural fiber parts 161 for separating the light generated in the fiber laser 168. The core interval of the fiber array is 150 µm, and the interval of the conversion parts is also 150 µm. Since the interval of the conversion parts is sufficiently large, mutual thermal influence can be suppressed to realize stable high-power characteristics. As a fundamental wave to the fiber array, one from the fiber laser 168 is used. Since the fiber laser can provide a high power fundamental wave in a single transverse mode, highly efficient conversion in the wavelength conversion element can be performed. The output from the pump light source 167 is dispersed into plural lights by the fiber array, i.e., the separated plural fiber parts. The infrared light generated in the fiber laser is dispersed by separating the fiber constituting the fiber laser, and the dispersed lights are wavelength-converted into the visible laser lights 11 by the plural wavelength conversion parts, thereby obtaining high power visible lights.

The wavelength conversion parts in the wavelength conversion element 3 may have several constructions. In this twelfth embodiment, as shown in FIG. 16(*b*), reflection coats are provided on the both surfaces of the non-linear optical material. The reflection coat 164 transmits visible light and reflects infrared light. On the other hand, the reflection coat 165 transmits infrared light and reflects visible light. A portion of the infrared light emitted from the fiber laser 168 is converted into visible light by the wavelength conversion element 3, and transmitted through the reflection coat 164 to be outputted as the laser light 11. The infrared light that has not been converted is reflected by the reflection coat 164, and the reflected infrared light again passes through the wavelength conversion element 3 to be converted into visible light. The light converted into visible light is reflected by the reflection coat 165, transmitted through the reflection coat 164, and emitted to the outside. Since the reflection films are thus provided, the infrared light is wavelength-converted reciprocatingly, thereby significantly enhancing the conversion efficiency.

On the other hand, the laser light source shown in FIG. 17 is obtained by providing non-reflection coats 172 and 173 on the both ends of the non-linear optical crystal 3 instead of the reflection coats 164 and 165 in the laser light source 103*v* of the twelfth embodiment shown in FIG. 16. Also in the laser light source of this construction, the infrared light emitted from the branched fibers 161 of the fiber laser 168 is wavelength-converted to visible light by the non-linear material 3. In this case, although the conversion efficiency of the laser light source is about half of that obtained in the twelfth embodiment shown in FIG. 16, it is possible to realize a laser light source having a simple construction and excellent stability.

While in this twelfth embodiment a fiber laser in which an end of an optical fiber constituting a single fiber laser is branched to plural fibers is adopted, plural fiber lasers may be adopted instead of the single fiber laser. In this case, light emitting sides of the plural fiber lasers are arranged in an array, and lights emitted from these fiber lasers are wavelength-converted as shown in FIG. 16(*b*) and FIG. 17, thereby realizing high output power. When using the plural fiber lasers, higher output characteristics can be obtained. Further, by setting the oscillation wavelengths of the plural fiber lasers to different wavelengths, the wavelength-converted visible light can include the plural wavelengths. In this case, it is necessary to design a periodic structure of polarization inversion so that the conditions of the wavelength conversion parts agree with the wavelengths from the respective fiber lasers. By generating visible lights of different wavelengths, speckle noise in the laser light can be reduced, resulting in high-quality image display. Further, the wavelength spectrums of the plural fiber lasers may be varied instead of varying the oscillation wavelengths of the plural fiber lasers.

Furthermore, a collimating optical system may be provided between the fibers and the wavelength conversion element, whereby the lights emitted from the fibers are collimated in the non-linear material 3 to enhance the conversion efficiency. In this case, the non-linear material 3 is slightly inclined with respect to the optical axes of the beams from the fibers, whereby the reflected lights from the non-linear material are prevented from returning into the fibers. If the strong fundamental wave returns to the fibers, the fiber facets might be damaged, or the fiber laser itself or the pump light source of the fiber laser might be damaged. Therefore, arranging the non-linear material 3 with an inclination to the optical axes of the beams from the fibers is an effective means in preventing such return lights.

While in the laser light source of the twelfth embodiment the wavelength conversion element has three conversion parts, the number of the conversion parts is not restricted thereto. Further, the interval between the respective conversion parts is not necessarily constant.

Embodiment 13

Figure 23:
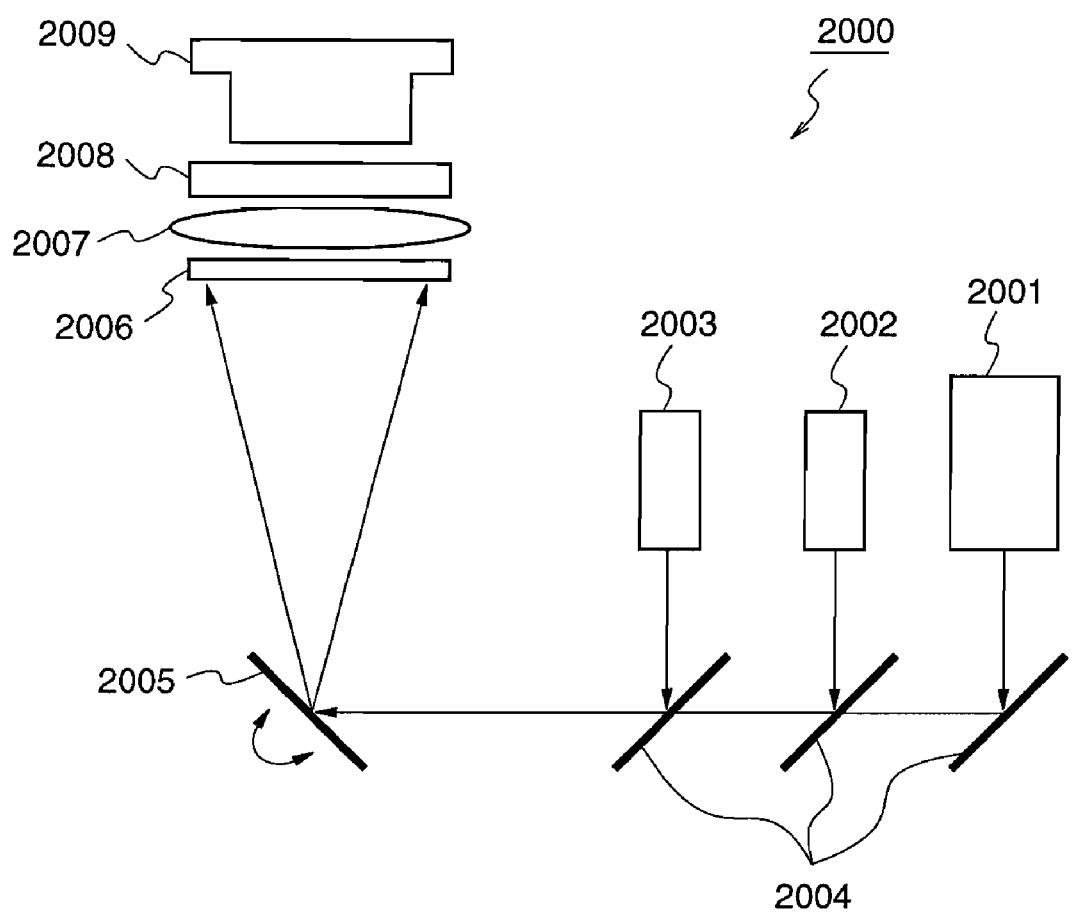
FIG. 23 is a configuration diagram for explaining a display device according to a thirteenth embodiment of the present invention.

FIG. 23 is a configuration diagram for explaining a display device according to a thirteenth embodiment of the present invention.

The display device 2000 according to the thirteenth embodiment comprises a red light source 2003, a blue light source 2002, a green light source 2001, a dichroic mirror 2004 for multiplexing lights from the respective light sources, a diffuser plate 2006 for diffusing incident light, a scanning mirror 2005 for scanning the multiplexed light on the diffuser plate 2006, a field lens 2007 for converting the light that has passed through the diffuser plate 2006 into collimated light, an SLM 2008 for performing image conversion of the collimated light, and a projection lens 2009 for projecting the image-converted light. In this thirteenth embodiment, the laser light source 103*a* of the first embodiment shown in FIG. 1 is used for the green light source 2001.

In this display device 2000, as shown in FIG. 23, the lights emitted from the red light source 2003, the blue light source 2002, and the green light source 2001 are multiplexed by the dichroic mirror 2004, and scanned by the scanning mirror 2005, whereby the multiplexed light is expanded so as to have a uniform light-quantity distribution in a two-dimensional plane of the SLM 2008 as an image conversion element. Further, the diffuser plate 2006 diffuses the incident light, and the light diffusion state on the diffuser plate is temporally varied by the scanning mirror 2005, thereby reducing speckle noise that is caused by the laser light. The light that has passed through the diffuser plate is converted into collimated light by the filed lens 2007, and the light that is image-converted by the SLM 2008 is projected onto an external screen by the projection lens 2009. Although miniaturization can be achieved by using a single plate SLM, in order to perform RGB full color display, it is necessary to adopt projection using a field sequential method in which the red, blue, and green lights are temporally switched to project the respective images. In the method of projecting the R, G, B images switchingly in time division, higher luminances are required for the luminances of the respective light sources than in the method of successively projecting the R, G, B images and thereafter combining the images.

Further, in this thirteenth embodiment, semiconductor lasers are used for the red light source 2003 and the blue light source 2002, while a light source obtained by combining a solid laser and a wavelength conversion element, which is the laser light source of the present invention, is used for the green light source 2001.

This is because it is difficult to directly oscillate green light in a semiconductor laser, and there is no light source for green light that has high output power and reliability. In the field sequential method, switching of R, G, B is performed with a frequency that is three times as high as that for switching of video. In the case of 1× speed video, switching of video is performed at 60 Hz, and the R, G, B light sources are switched at 180 Hz that is three times as high as 60 Hz. Since the light switching speed when projecting video is as low as several 100 to several KHz, the temperature rise in the light sources can follow this speed. Therefore, an increase in the light peak power by a pulse cannot be expected, and high-power characteristics in CW operation (continuous operation) are required of the light source. For example, in order to project an image having a luminance of 100 lm, the green light source must output a high power pulse that is about 0.5 W for an average power and about 1 to 2 W for a peak power, and it is difficult for an ordinary solid laser and wavelength conversion element having no cooling mechanism to perform stable oscillation. Therefore, the light source having the plural pump parts according to the present invention becomes very effective. By reducing the luminance levels at the respective light emitting points, stable oscillation can be performed, and the total light quantity can be increased. Accordingly, a cooling device such as a Peltier element or a water cooler is dispensed with, thereby realizing miniaturization and low power consumption. Since the average power is not very high, the power consumption of the light source can be reduced, thereby realizing a small-size display device with reduced heat generation in the light source.

Since the display device according to the thirteenth embodiment visualizes the incident light by the two-dimensional image conversion element, there occurs no adverse effect that the beam quality is degraded due to the light source having plural beams. Since interference of laser lights can be reduced by having the plural beams, speckle noise is reduced, and image deterioration is avoided.

The power consumptions of the R, G, B light sources are larger in order of R>G>B. Therefore, in the construction of the small-size display device, it is desired to separate the position of the red light source from the position of the green light source as shown in FIG. 23. Thereby, influence of heat generation between the light sources can be reduced.

While in the display device of the thirteenth embodiment the laser light source according to the first embodiment of the present invention is used for the green light source 2001, the laser light source according to any of the second to twelfth embodiments of the present invention may be used for the green light source 2001.

APPLICABILITY IN INDUSTRY

The present invention enables a high solid laser by making a microchip laser perform multiemission, and simultaneously, achieves stable output power by stabilizing a transverse mode and a longitudinal mode in the solid laser. Since a high-power and small-size laser light source with less output fluctuation can be realized, its effect in practical use is large. Further, since a small-size display device can be realized by applying the laser light source of the present invention to a display device, its effect in practical use is large. Further, a high-definition display device with reduced speckle noise is realized by applying the laser light source of the present invention to a display device, its effect in practical is large.

The invention claimed is:

1. A laser light source comprising: plural semiconductor lasers; a solid laser medium; a wavelength conversion element; a first reflection layer formed on one facet of the solid laser medium; and a second reflection layer formed on one facet of the wavelength conversion element, wherein the solid laser medium and the wavelength conversion element are disposed between the first reflection layer and the second reflection layer; the first reflection layer and the second reflection layer form a laser resonator having both reflection end facets approximately parallel to each other; plural pump parts of the solid laser medium are pumped by the plural semiconductor lasers; the plural pump parts are separated from each other by 300 μm or more; the solid laser medium comprises plural solid lasers having different compositions or materials; the wavelength conversion element has plural parts having difference phase matches; the solid lasers generate laser lights of difference wavelengths for the respective pump parts; and the plural pump parts of the solid laser medium have different temperatures in the respective oscillation states, and oscillate laser lights having different oscillation wavelengths or different oscillation spectrums due to the temperature differences.

2. A laser light source as defined in claim 1 wherein
the number of the plural semiconductor lasers is three or more;
three or more pump parts of the solid laser medium are pumped by the three or more semiconductor lasers; and
the three or more pump parts are arranged so as not to be positioned on the same straight line.

3. A laser light source as defined in claim 1, wherein
the plural pump parts are separated from each other by a heat separation mechanism.

4. A laser light source as defined in claim 1, wherein
the solid laser medium comprises a ceramic material; and
at least one of the plural pump parts in the solid laser medium has a composition or a material different from those of other pump parts.

5. A laser light source as defined in claim 1, wherein
the number of the plural semiconductor lasers is three or more;
three or more pump parts of the solid laser medium are pumped by the three or more semiconductor lasers;
the three or more pump parts are arranged so as not to be positioned on the same straight line;
the solid laser medium comprises a ceramic material; and
at least one of the plural pump parts in the solid laser medium has a composition or a material different from those of other pump parts.

6. A laser light source as defined in claim 1, wherein
the plural pump parts are separated from each other by a heat separation mechanism;
the solid laser medium comprises a ceramic material; and
at least one of the plural pump parts in the solid laser medium has a composition or a material different from those of other pump parts.

* * * * *